US011936271B2

(12) United States Patent
Ozer et al.

(10) Patent No.: US 11,936,271 B2
(45) Date of Patent: Mar. 19, 2024

(54) REPLACEABLE WINDINGS FOR AN ELECTROMAGNETIC MACHINE

(71) Applicant: HYPERLOOP TECHNOLOGIES, INC., Los Angeles, CA (US)

(72) Inventors: Rachel Ozer, Los Angeles, CA (US); Noel Godinez, Los Angeles, CA (US); George Tirone, Los Angeles, CA (US); Tim Lambert, Los Angeles, CA (US); Irfan-ur-rab Usman, Los Angeles, CA (US); Yingjie Li, Los Angeles, CA (US)

(73) Assignee: HYPERLOOP TECHNOLOGIES, INC., Los Angeles, CA (US)

( * ) Notice: Subject to any disclaimer, the term of this patent is extended or adjusted under 35 U.S.C. 154(b) by 45 days.

(21) Appl. No.: 17/773,988

(22) PCT Filed: Nov. 5, 2020

(86) PCT No.: PCT/US2020/059023
§ 371 (c)(1),
(2) Date: May 3, 2022

(87) PCT Pub. No.: WO2021/092114
PCT Pub. Date: May 14, 2021

(65) Prior Publication Data
US 2022/0376563 A1 Nov. 24, 2022

Related U.S. Application Data

(60) Provisional application No. 62/945,978, filed on Dec. 10, 2019, provisional application No. 62/932,113, (Continued)

(51) Int. Cl.
*H02K 41/03* (2006.01)
*H01F 7/06* (2006.01)
(Continued)

(52) U.S. Cl.
CPC ............. *H02K 41/03* (2013.01); *H01F 7/064* (2013.01); *H01F 7/081* (2013.01); *H01F 27/28* (2013.01);
(Continued)

(58) Field of Classification Search
CPC ........ B60L 13/03; B60L 15/2009; B60L 7/28; H02K 1/14; H02K 1/18; H02K 2201/15;
(Continued)

(56) References Cited

U.S. PATENT DOCUMENTS 4,544,856 A 10/1985 King
4,689,529 A 8/1987 Higuichi
(Continued)

FOREIGN PATENT DOCUMENTS

DE 19732564 A1 2/1999
DE 102006027819 A1 12/2007
(Continued)

OTHER PUBLICATIONS

"International Search Report" dated Mar. 1, 2021, issued in corresponding PCT Application No. PCT/US2020/059010, Filed Nov. 5, 2020.
(Continued)

*Primary Examiner* — Naishadh N Desai
(74) *Attorney, Agent, or Firm* — Seyfarth Shaw LLP

(57) ABSTRACT

Replaceable windings (101) for an electromagnetic machine (100) are provided. A replaceable winding (101) comprises a body (107) having a longitudinal axis (105), the body (107) comprising opposing surfaces along the longitudinal axis (105). The replaceable winding (101) further comprises an aperture (119) through the body (107), between the opposing surfaces, the aperture (119) having generally parallel internal sides about perpendicular to the opposing surfaces of the body (107), the aperture (119) configured to
(Continued)

removably received a pole portion (109) of the electromagnetic machine (100). The replaceable winding (101) further comprises electrical conductors wound about the aperture (119) in the body (107). The replaceable winding (101) further comprises electrical connectors (123) at one or more external sides of the body (107), the electrical connectors (123) connected to the electrical conductors.

18 Claims, 28 Drawing Sheets

Related U.S. Application Data filed on Nov. 7, 2019, provisional application No. 62/932,077, filed on Nov. 7, 2019, provisional application No. 62/931,987, filed on Nov. 7, 2019, provisional application No. 62/932,013, filed on Nov. 7, 2019, provisional application No. 62/931,935, filed on Nov. 7, 2019.

(51) Int. Cl.

| | | |
|---|---|---|
| *H01F 7/08* | (2006.01) | |
| *H01F 27/28* | (2006.01) | |
| *H02K 1/14* | (2006.01) | |
| *H02K 1/18* | (2006.01) | |
| *H02K 1/20* | (2006.01) | |
| *H02K 3/04* | (2006.01) | |
| *H02K 5/22* | (2006.01) | |
| *H02K 9/22* | (2006.01) | |
| *H02K 11/21* | (2016.01) | |
| *H02K 11/25* | (2016.01) | |
| *H02K 41/025* | (2006.01) | |
| *H02K 49/04* | (2006.01) | |
| *H05K 7/20* | (2006.01) | |
| *H02K 7/10* | (2006.01) | |

(52) U.S. Cl.
CPC .............. *H02K 1/14* (2013.01); *H02K 1/143* (2013.01); *H02K 1/18* (2013.01); *H02K 1/20* (2013.01); *H02K 3/04* (2013.01); *H02K 5/225* (2013.01); *H02K 9/227* (2021.01); *H02K 11/21* (2016.01); *H02K 11/25* (2016.01); *H02K 41/025* (2013.01); *H02K 41/031* (2013.01); *H02K 49/046* (2013.01); *H05K 7/20254* (2013.01); *H01F 2007/086* (2013.01); *H02K 7/10* (2013.01); *H02K 2201/15* (2013.01); *H02K 2213/12* (2013.01)

(58) Field of Classification Search
CPC .. H02K 2213/12; H02K 41/03; H02K 41/031; H02K 9/227; H02K 1/141; H02K 1/143; H02K 1/148; H02K 1/185; H02K 1/20; H02K 11/21; H02K 11/25; H02K 11/40; H02K 15/022; H02K 2201/12; H02K 3/04; H02K 3/18; H02K 3/40; H02K 3/52; H02K 41/025; H02K 49/046; H02K 5/225; H02K 7/10; H02K 7/104; Y02T 10/64; Y02T 10/72; H01F 2007/086; H01F 27/28; H01F 7/064; H01F 7/081; H05K 7/20254

See application file for complete search history.

(56) References Cited

U.S. PATENT DOCUMENTS

| | | |
|---|---|---|
| 4,788,477 A | 11/1988 | Teramachi et al. |
| 5,289,088 A | 2/1994 | Andoh |
| 5,868,077 A | 2/1999 | Kuznetsov |
| 6,522,035 B1 | 2/2003 | Smit |
| 2002/0053835 A1 | 5/2002 | Joong et al. |
| 2002/0081528 A1 | 6/2002 | Miyajima et al. |
| 2005/0029874 A1 | 2/2005 | Dadd |
| 2006/0131967 A1 | 6/2006 | Lin et al. |
| 2008/0143202 A1* | 6/2008 | Whitener ................ H02K 3/51 29/598 |
| 2012/0249991 A1 | 10/2012 | Hol et al. |
| 2013/0015725 A1 | 1/2013 | Trammell |
| 2013/0113320 A1 | 5/2013 | Calley et al. |
| 2015/0091393 A1* | 4/2015 | Hayner .................... H02K 5/18 310/12.29 |
| 2015/0171706 A1 | 6/2015 | Dadd |
| 2017/0346373 A1* | 11/2017 | Pabut ...................... H02K 3/47 |
| 2018/0131258 A1* | 5/2018 | Dawidowicz .......... H02K 1/141 |

FOREIGN PATENT DOCUMENTS

| | | |
|---|---|---|
| EP | 0093547 A1 | 11/1983 |
| EP | 1213819 A2 | 6/2002 |
| EP | 1511164 A2 | 3/2005 |
| EP | 1544980 A1 | 6/2005 |
| EP | 2876783 A1 | 5/2015 |
| EP | 3107195 A1 | 12/2016 |
| EP | 3258131 A1 | 12/2017 |
| FR | 1165541 A1 | 10/1958 |
| FR | 2526570 A1 | 11/1983 |
| JP | S586055 A | 1/1983 |
| JP | S5886859 A | 5/1983 |
| JP | S6098864 A | 6/1985 |
| WO | 03105317 A1 | 12/2003 |
| WO | 2008142001 A2 | 11/2008 |

OTHER PUBLICATIONS

"International Search Report" dated Feb. 15, 2021, issued in corresponding PCT Application No. PCT/US2020/059012, Filed Nov. 5, 2020.
Molnar, Sabinus, "International Search Report" dated Feb. 23, 2021, issued in corresponding PCT Application No. PCT/US2020/059017, Filed Nov. 5, 2020.
Molnar, Sabinus, "International Search Report" dated Feb. 24, 2021, issued in corresponding PCT Application No. PCT/US2020/059023, Filed Nov. 5, 2020.
Contreras, Sampayo, J., "International Search Report" dated Apr. 15, 2021, issued in corresponding PCT Application No. PCT/US2020/059028, Filed Nov. 5, 2020.
Kovacsovics, Martin, "International Search Report", dated Mar. 1, 2021, issued in corresponding PCT Application No. PCT/US2020/059036, Filed Nov. 5, 2020.

* cited by examiner

US 11,936,271 B2

REPLACEABLE WINDINGS FOR AN ELECTROMAGNETIC MACHINE

CROSS-REFERENCE TO RELATED APPLICATIONS

This application claims priority from US Provisional Patent Applications having Ser. Nos. 62/932,013, 62/931,987, 62/931,935, 62/932,077, 62/932,113, all of which were filed on Nov. 7, 2019, and the entire contents of which are incorporated herein by reference; this application further claims priority from US Provisional Patent Application having Ser. No. 62/945,978, filed on Dec. 10, 2019, the entire contents of which is incorporated herein by reference.

BACKGROUND

The constraints of a transportation system that seeks to promote high speed, high efficiency, and high power density, impose challenges that are not present in the state of the art. In particular, such a transportation system may include various electromagnetic machines for levitation, guidance, braking, and the like. Delays in maintenance of such electromagnetic machines may interfere with operation of the transportation system.

BRIEF DESCRIPTIONS OF THE DRAWINGS

For a better understanding of the various examples described herein and to show more clearly how they may be carried into effect, reference will now be made, by way of example only, to the accompanying drawings in which.

Figure 8:
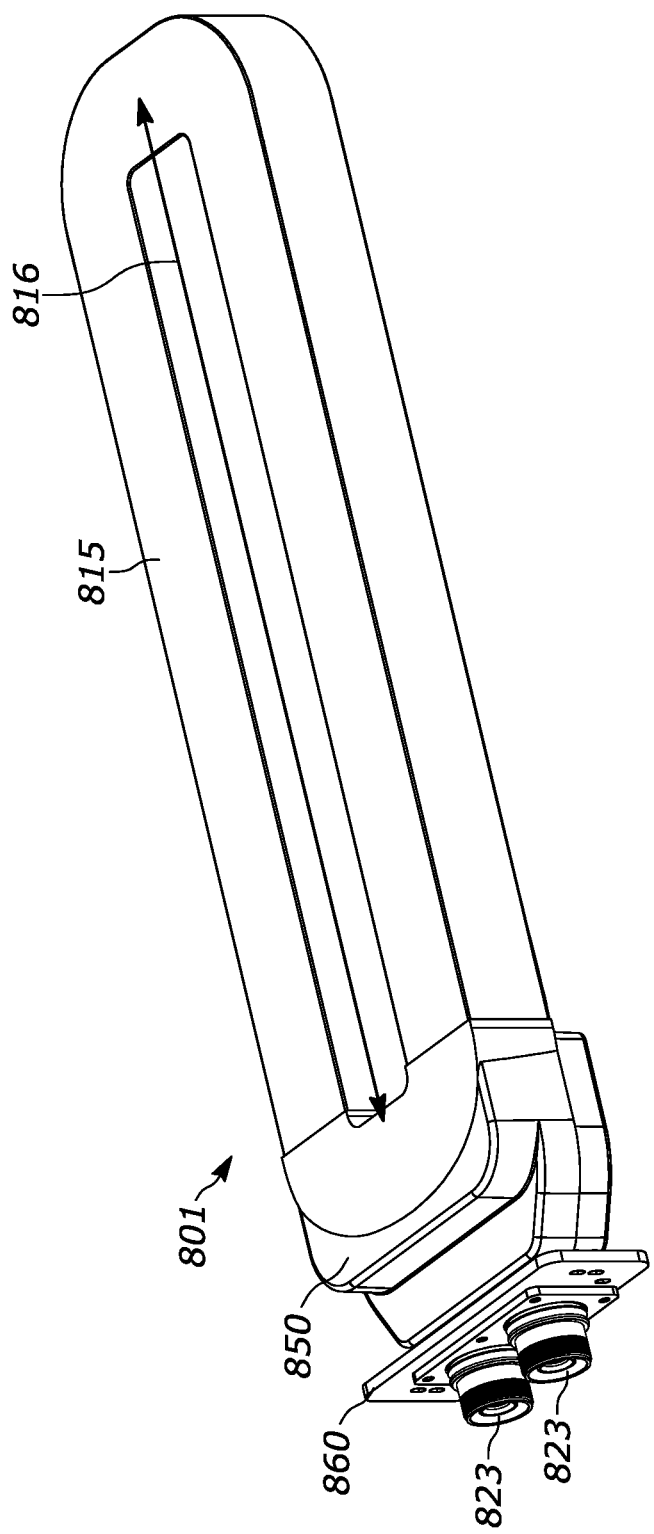
FIG. 8 depicts a perspective view of replaceable windings with electrical connectors located at a longitudinal end, according to non-limiting examples.
Figure 9A:
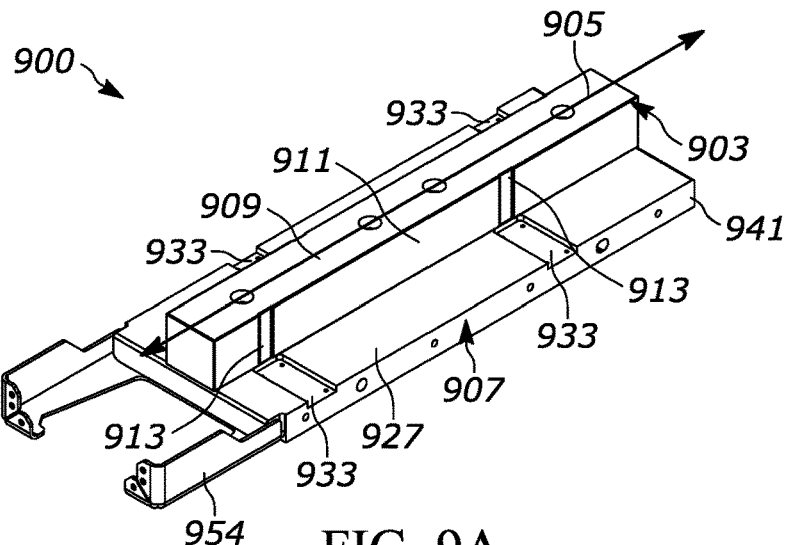
Figure 9B:
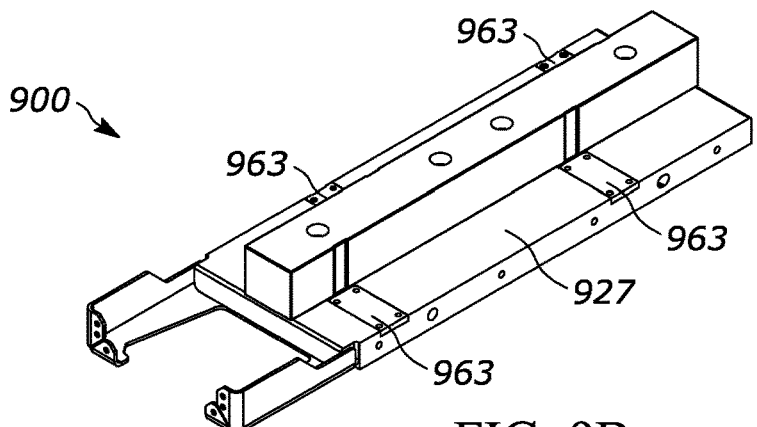
Figure 9C:
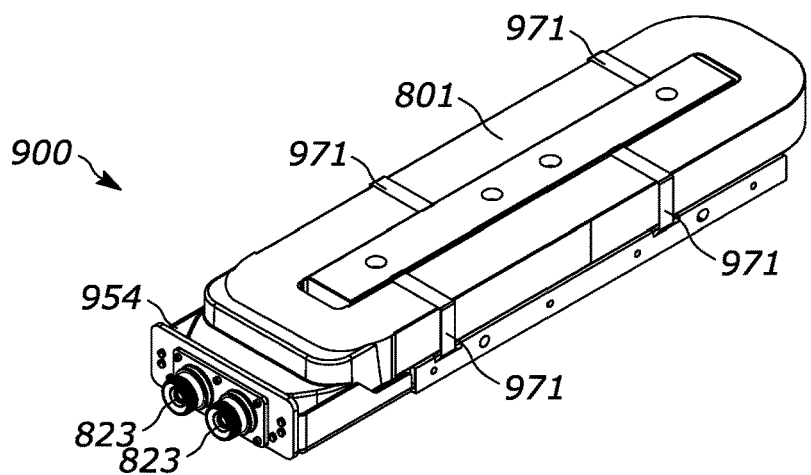

FIG. 9A, FIG. 9B, and FIG. 9C depict perspective views of the replaceable winding of FIG. 8C being replaced at an electromagnetic machine, according to non-limiting examples.

Figure 10A:
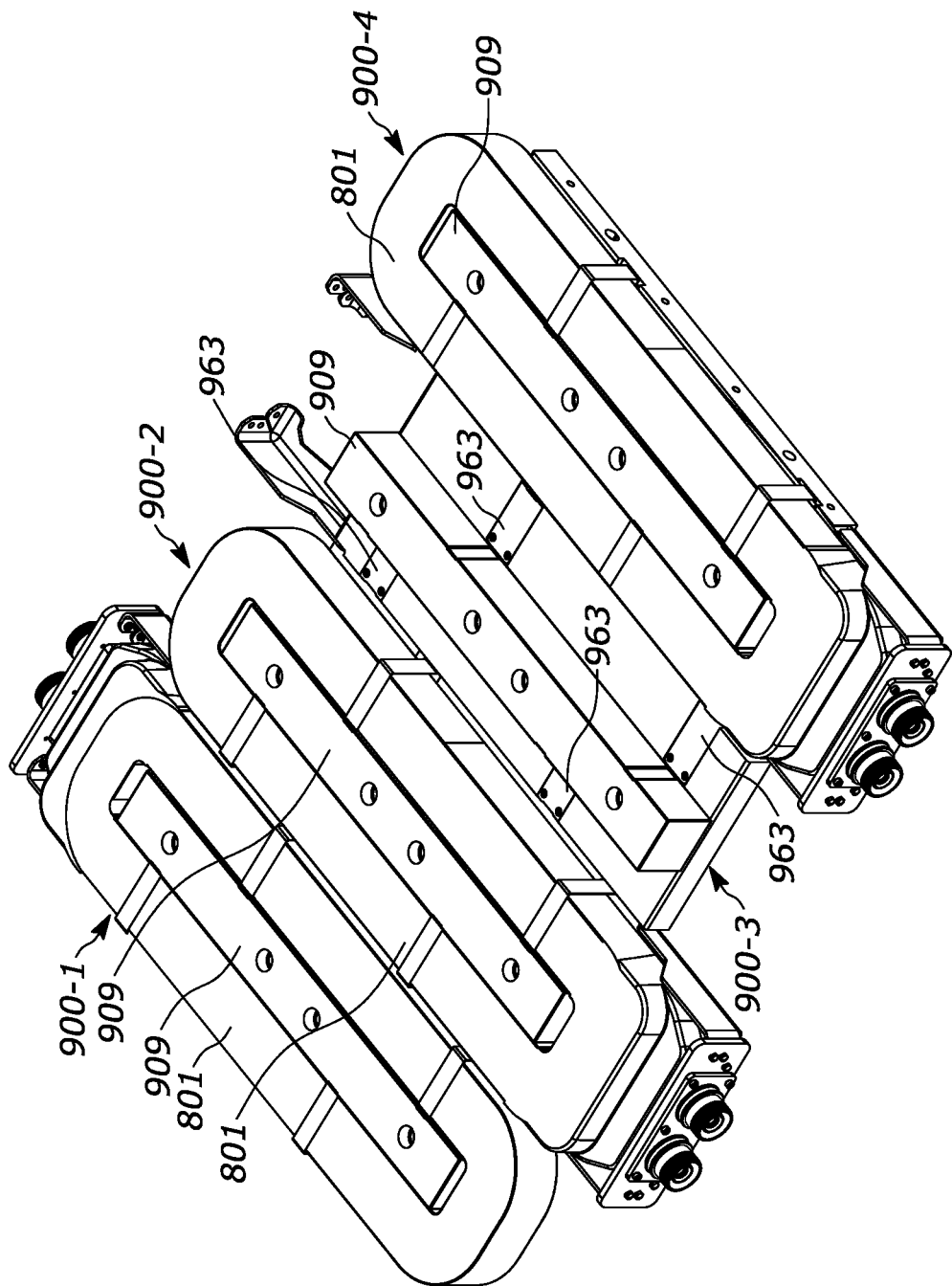

FIG. 10A depicts a perspective view of electromagnetic machines of FIG. 9C being interconnected, and with a replaceable winding of one of the electromagnetic machines removed, according to non-limiting examples.

Figure 10B:
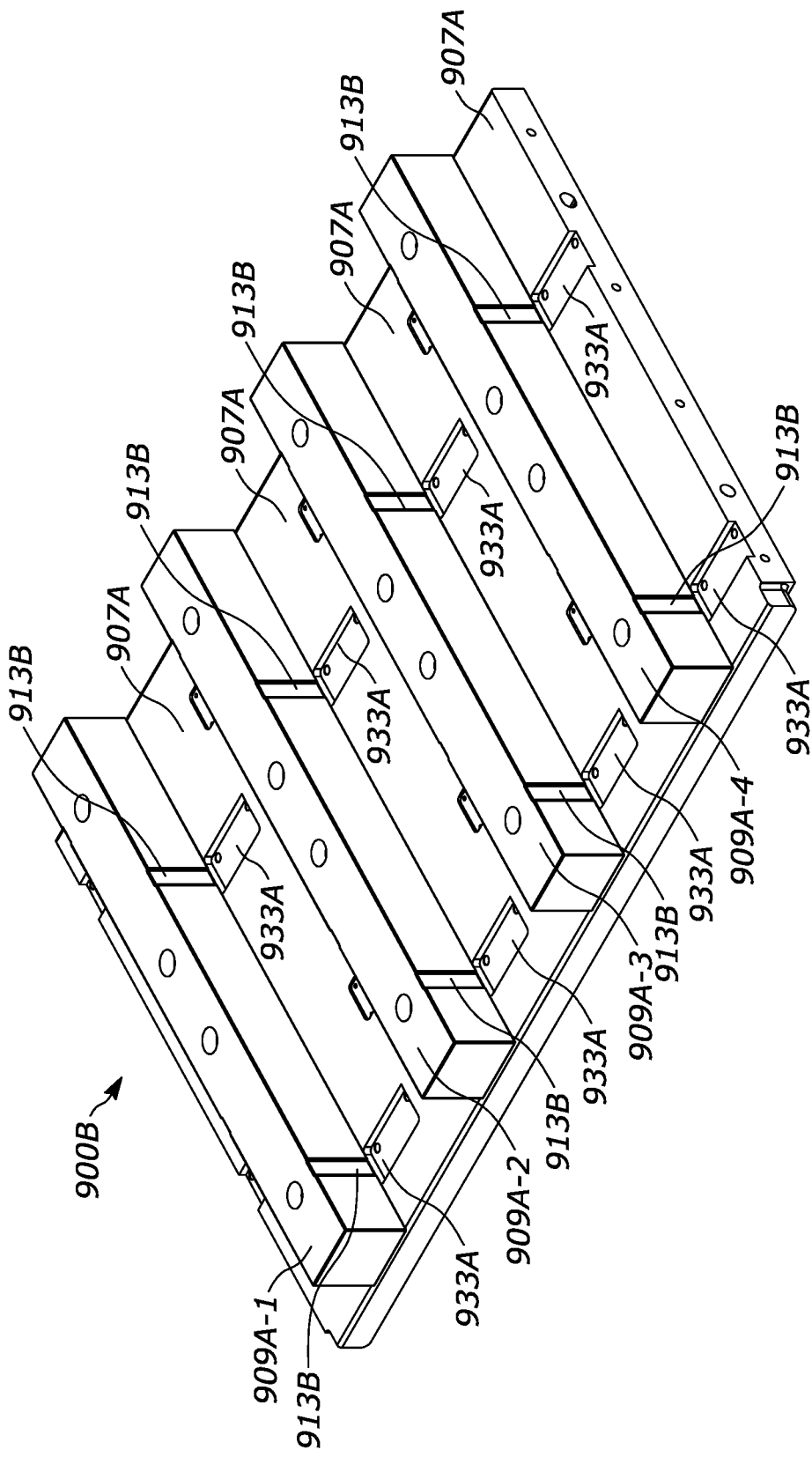

FIG. 10B depicts a perspective view of an electromagnetic machine having a plurality of pole portions and a common back-iron portion, with replaceable windings removed to show strap retainers, according to non-limiting examples.

Figure 11A:
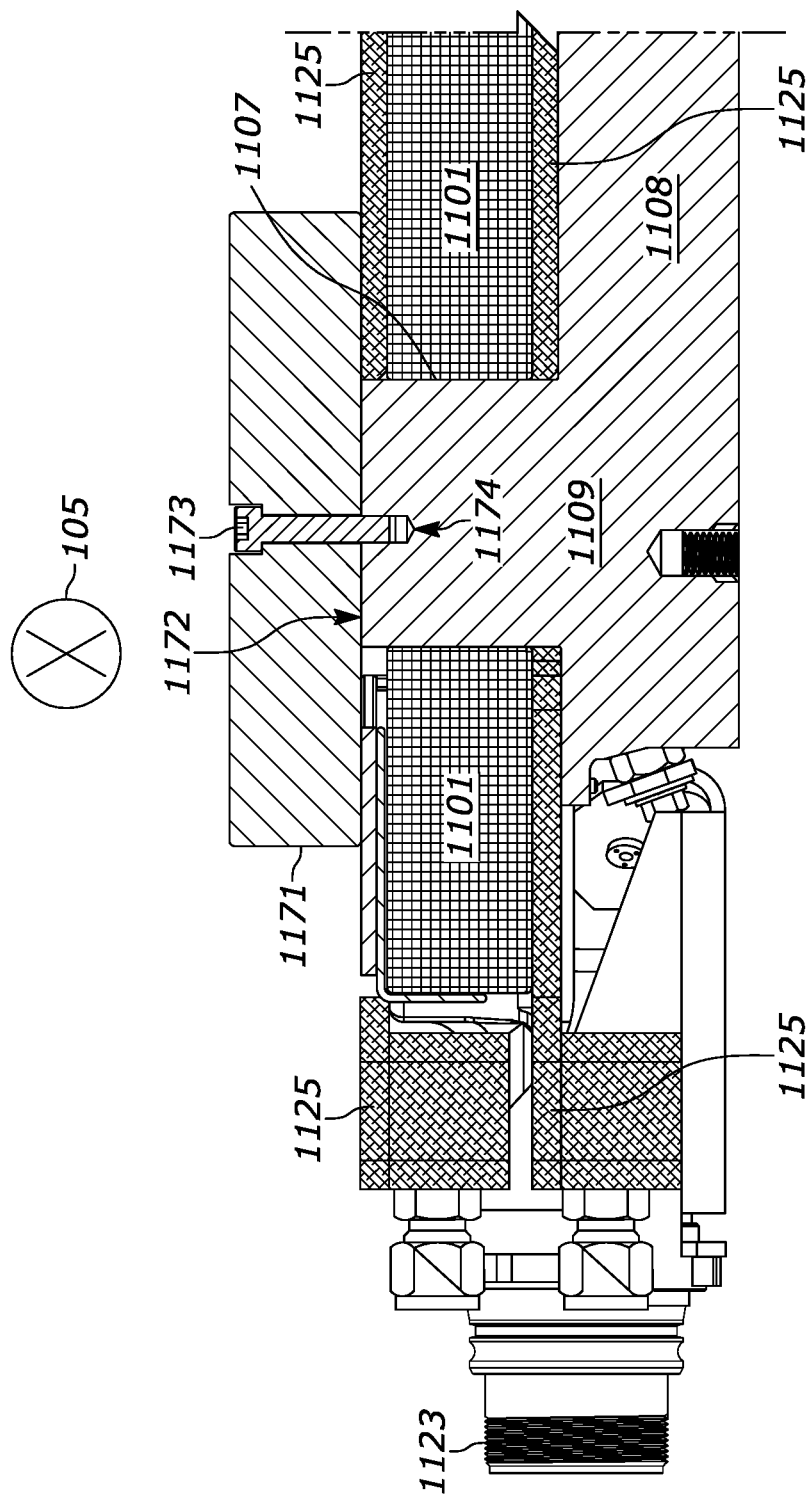
Figure 11B:
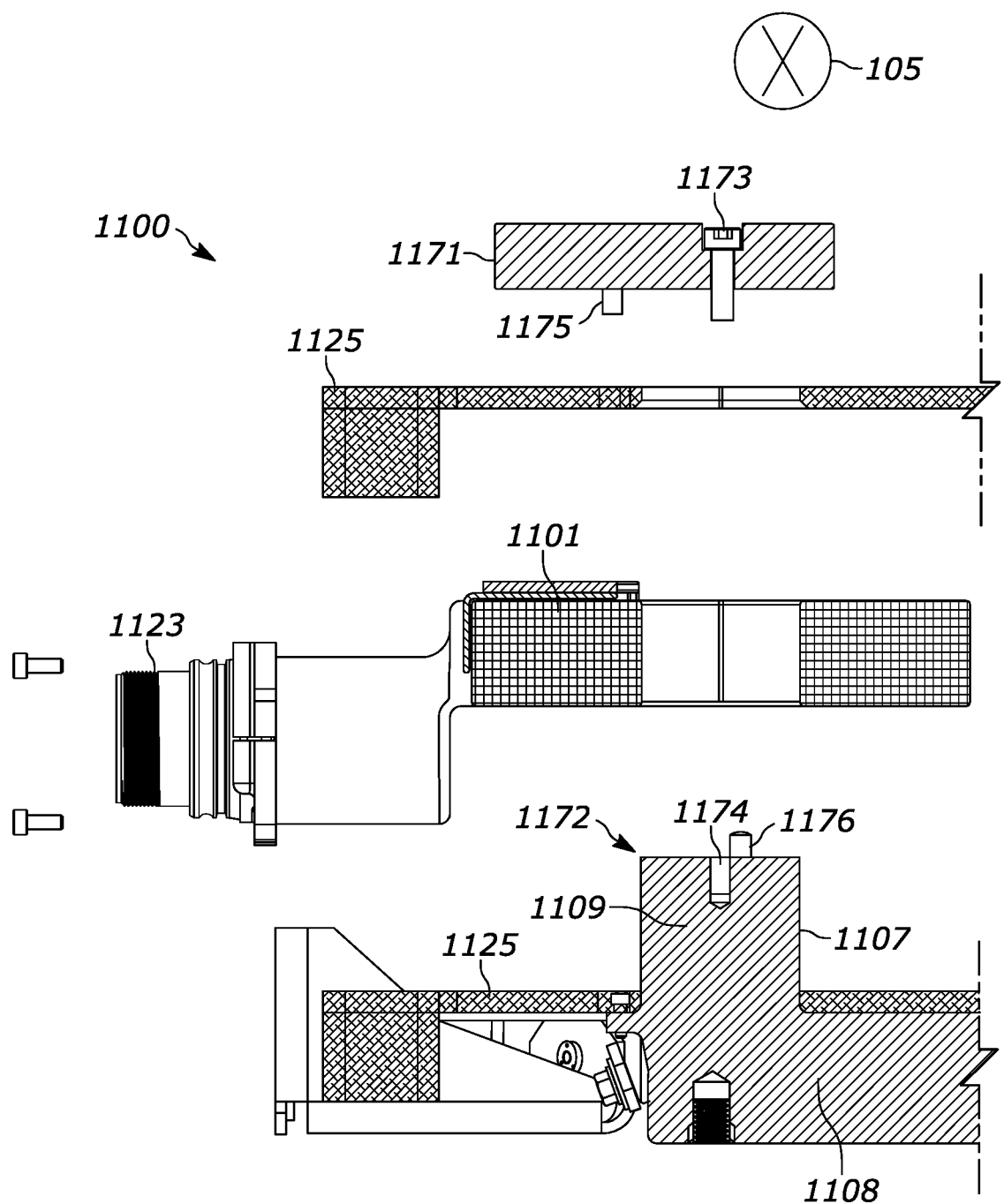

FIG. 11A and FIG. 11B which respectively depict a cross-sectional side view and a cross-sectional partially exploded view of another electromagnetic machine with replaceable windings, according to non-limiting examples.

FIG. 12A, FIG. 12B, FIG. 12C and FIG. 12D respectively depict portions of electromagnetic machines having different retention mechanisms for retaining electrical windings, according to non-limiting examples.

Figure 13A:
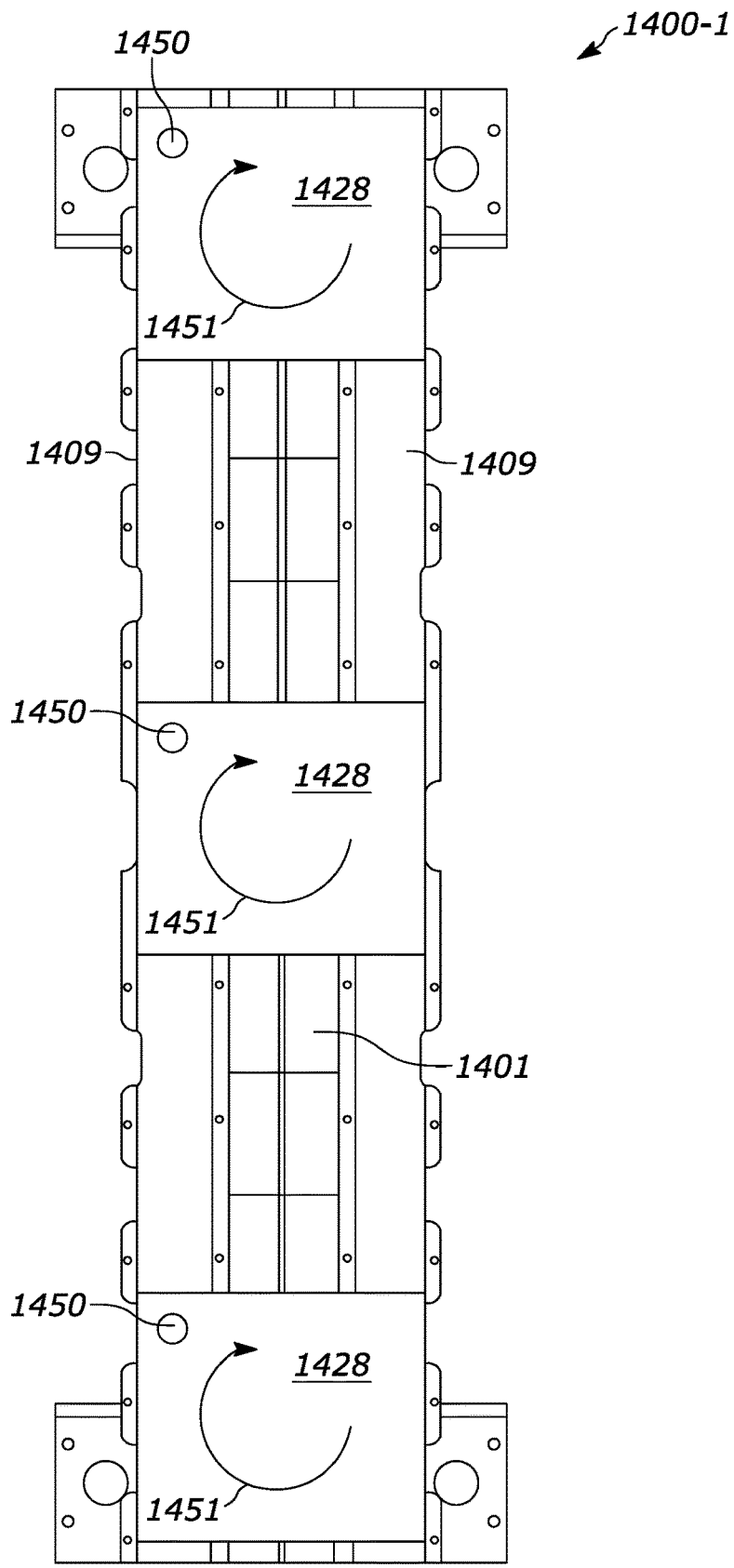
Figure 13B:
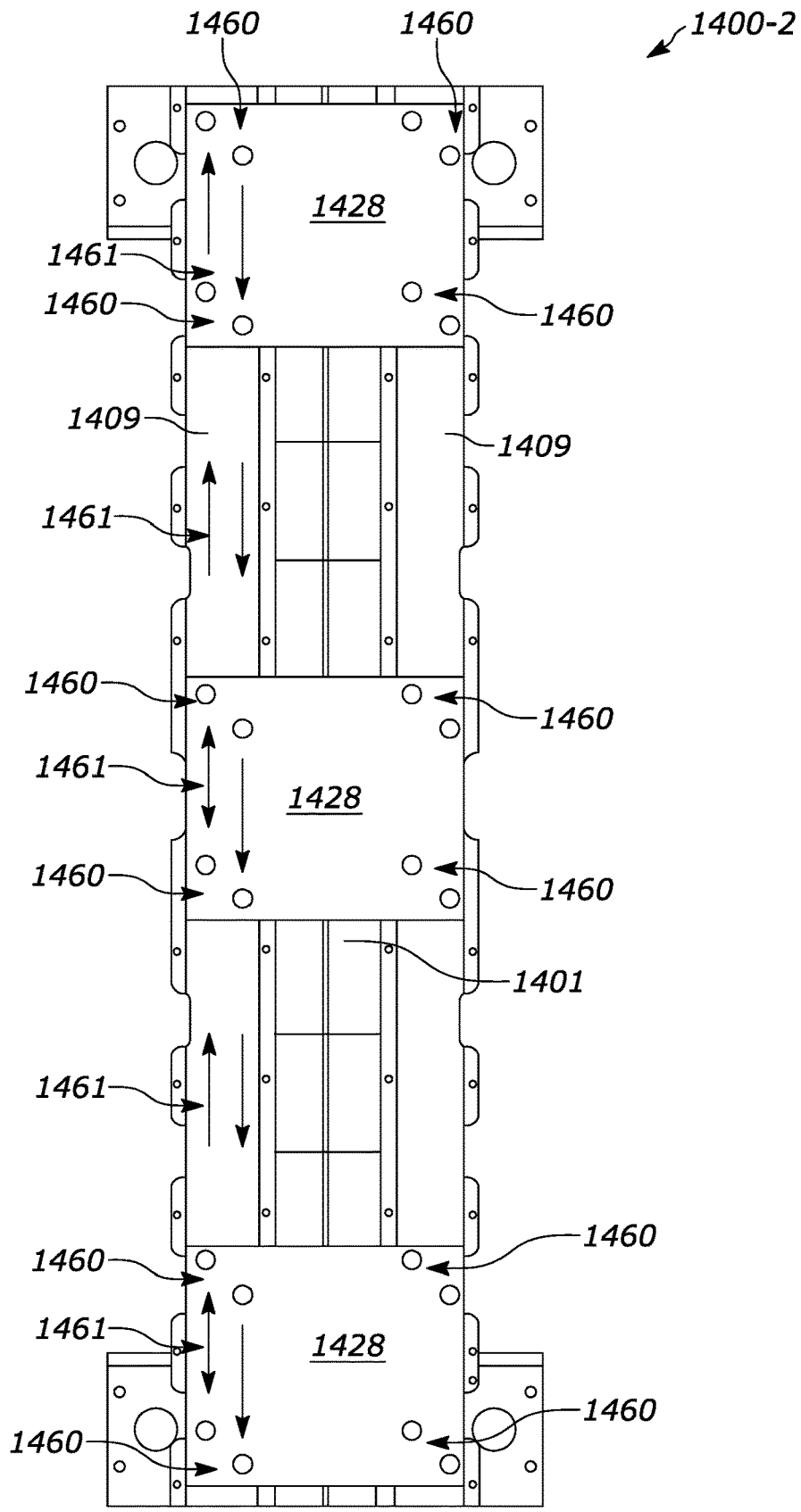

FIG. 13A, and FIG. 13B, respectively depict portions of electromagnetic machines having retention mechanisms with, and without single point bonding, according to non-limiting examples.

Figure 14A:
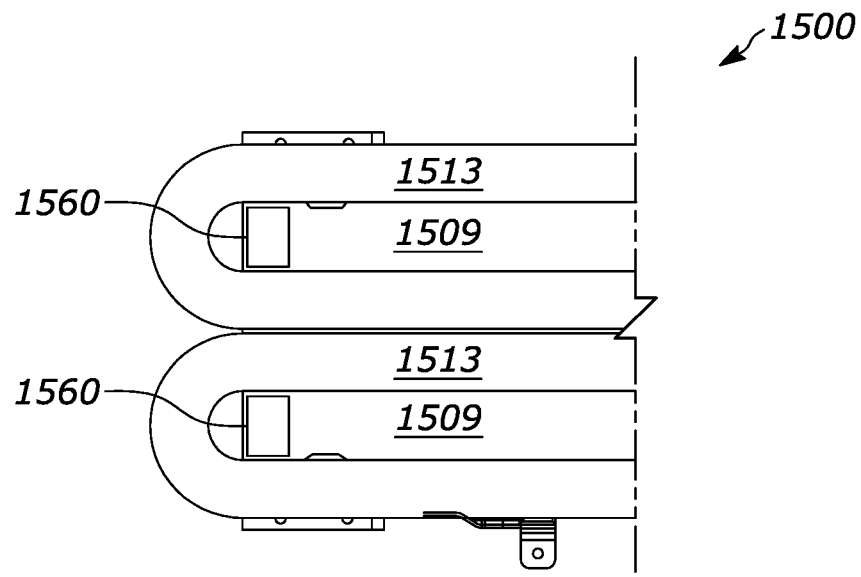
Figure 14B:
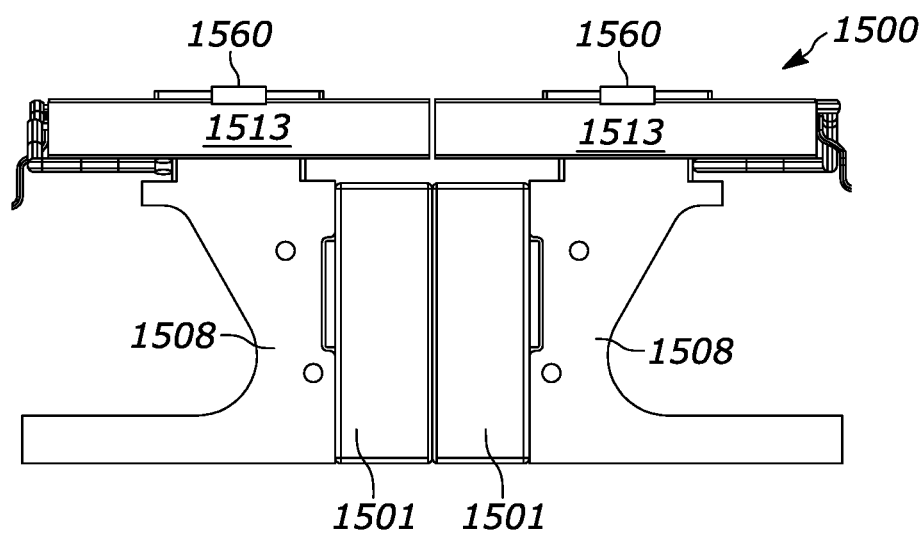
Figure 14C:
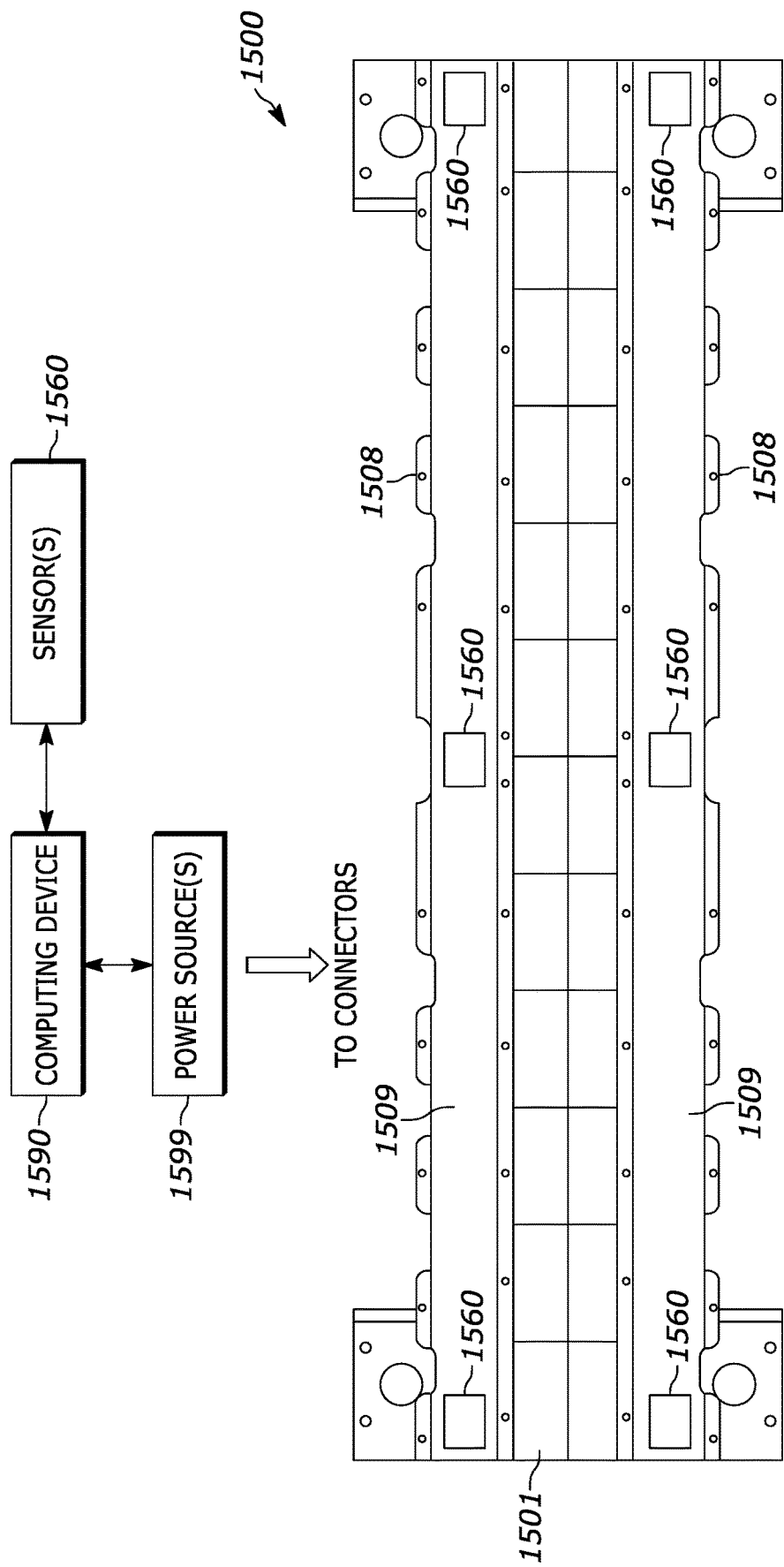

FIG. 14A, FIG. 14B, and FIG. 14C respectively depict: a top view of an end of an electromagnetic machine with magnetic flux sensors; an end view of the electromagnetic machine with magnetic flux sensors; and a top of the electromagnetic machine with magnetic flux sensors with electrical windings, and other components removed, according to non-limiting examples.

Figure 15A:
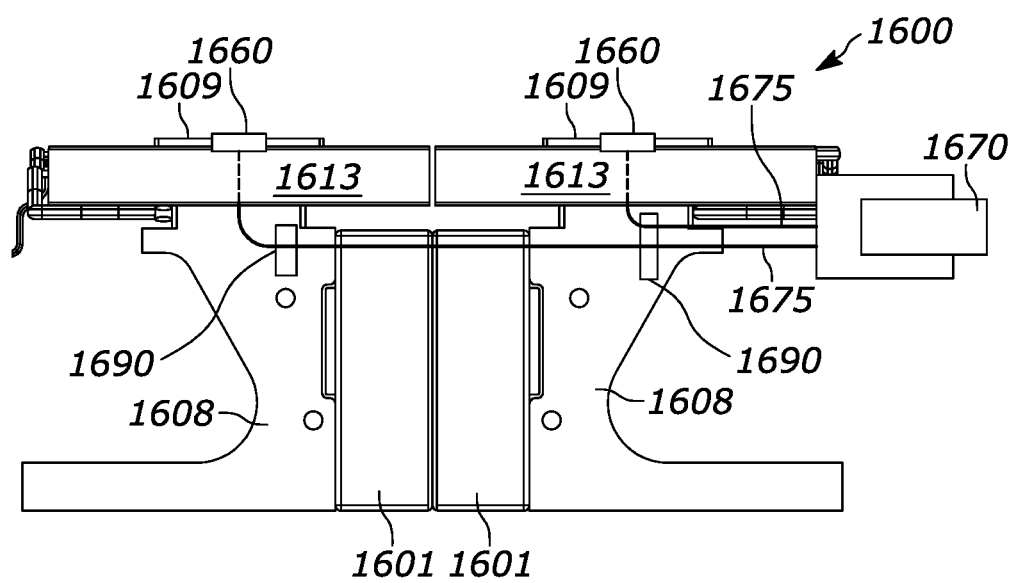
Figure 15B:
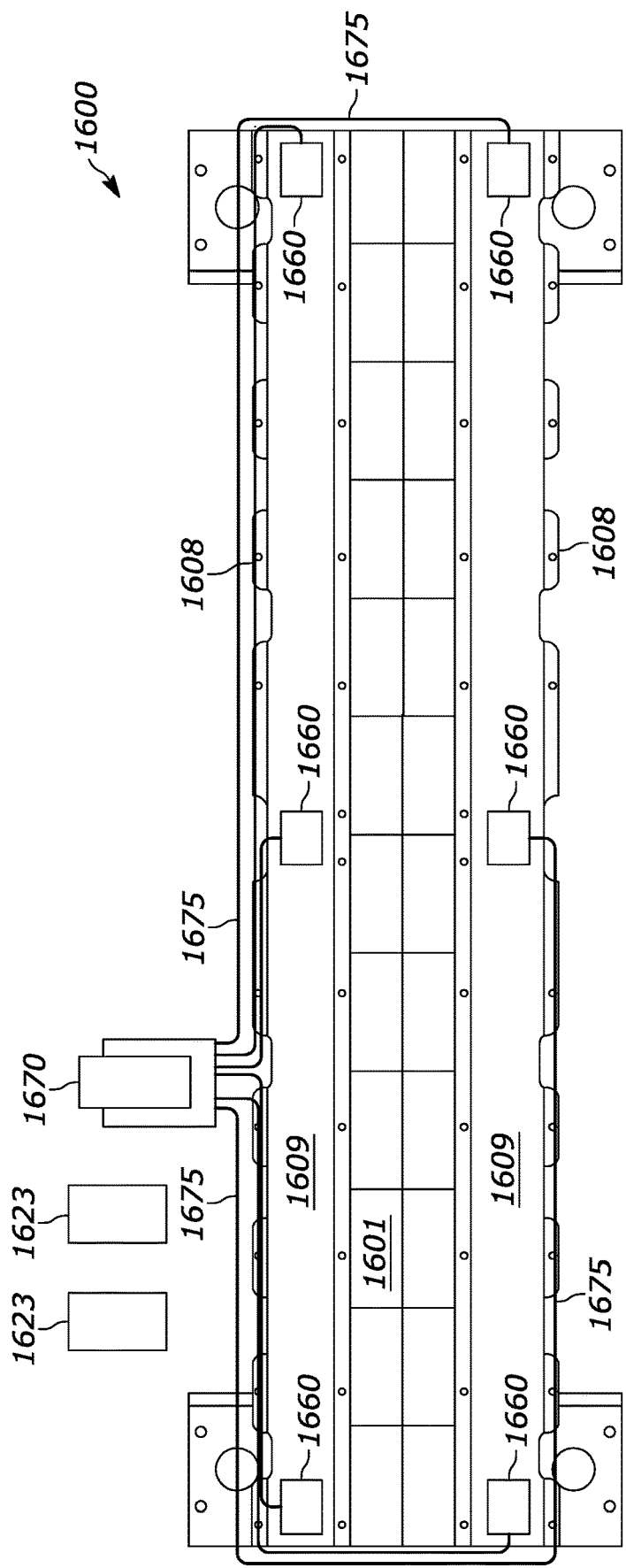

FIG. 15A and FIG. 15B respectively depict: an end view and a top view of an electromagnetic machine, the showing the electromagnetic machine with electrical windings, and other components removed; the electromagnetic machine includes magnetic flux sensors, a data connector and harnessing therebetween, according to non-limiting examples.

Figure 16A:
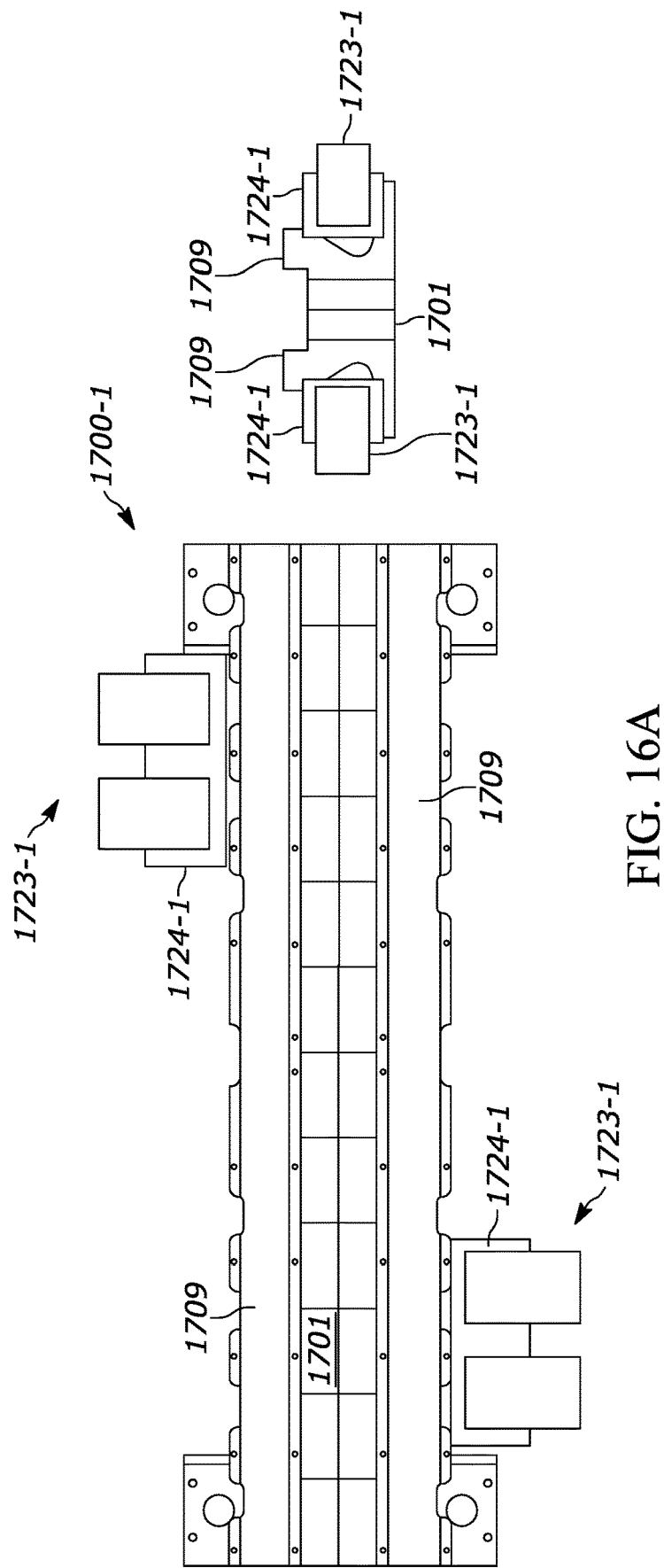
Figure 16B:
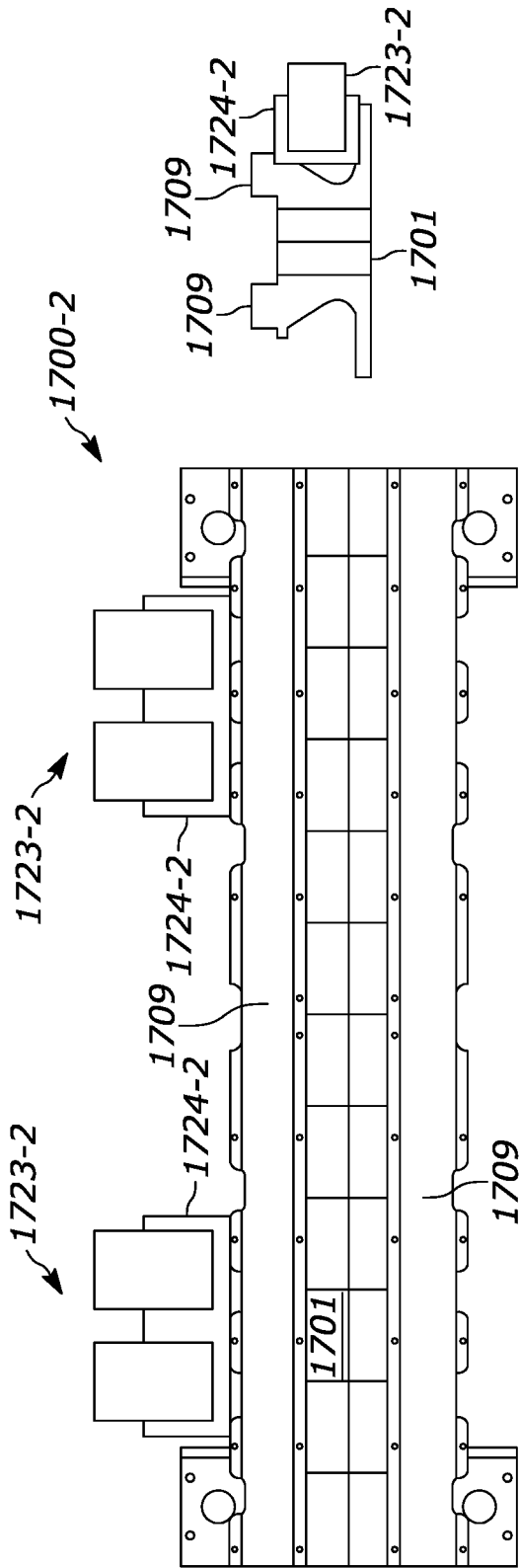
Figure 16C:
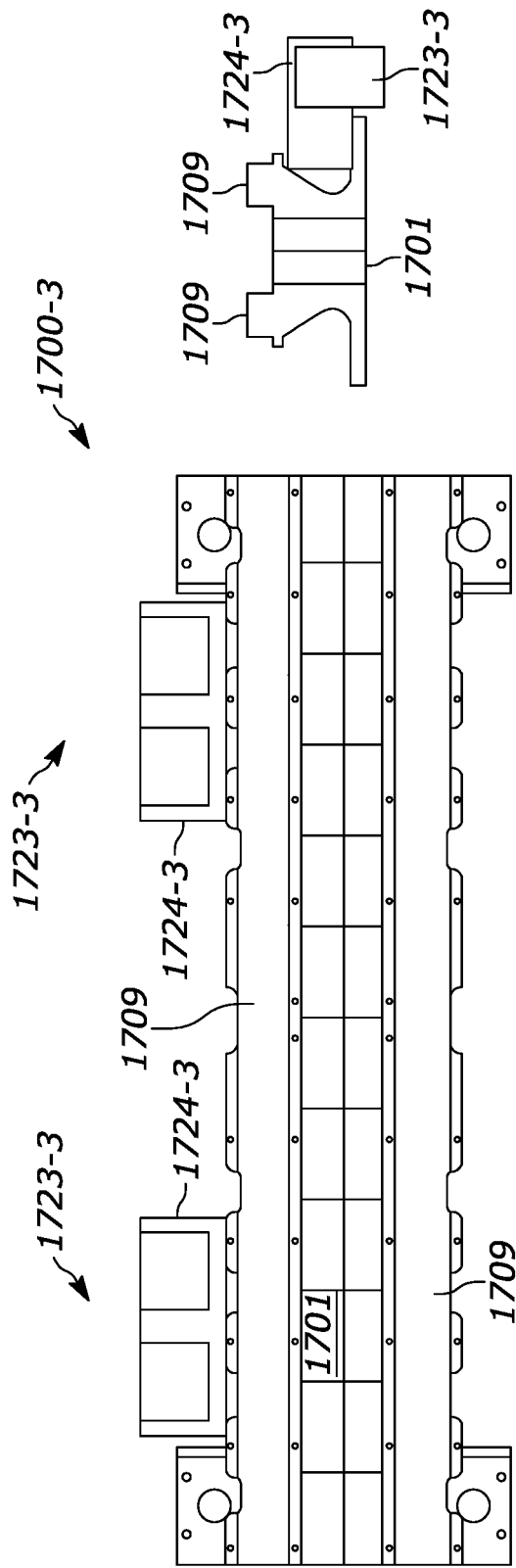

FIG. 16A, FIG. 16B, and FIG. 16C respectively depict portions of electromagnetic machines having different connectors to respective electrical windings, according to non-limiting examples.

Figure 17A:
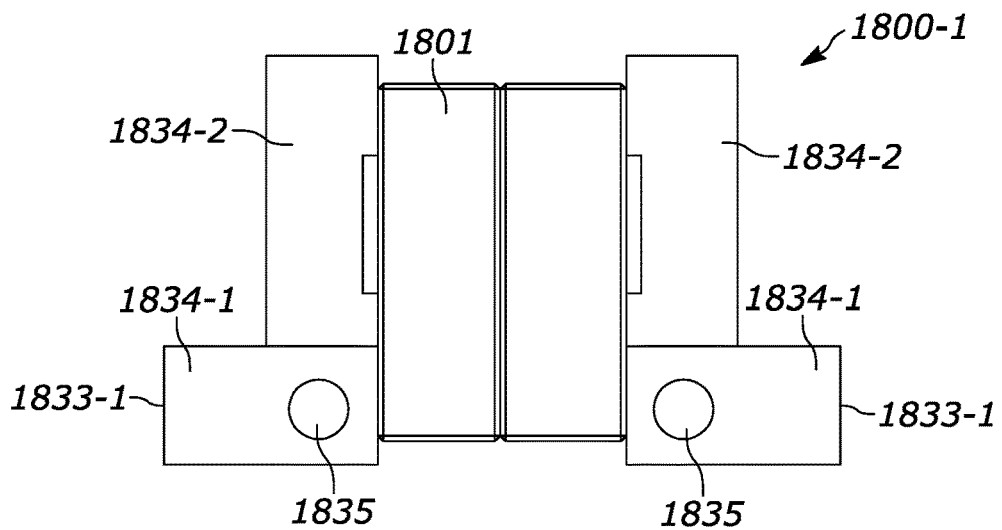
Figure 17B:
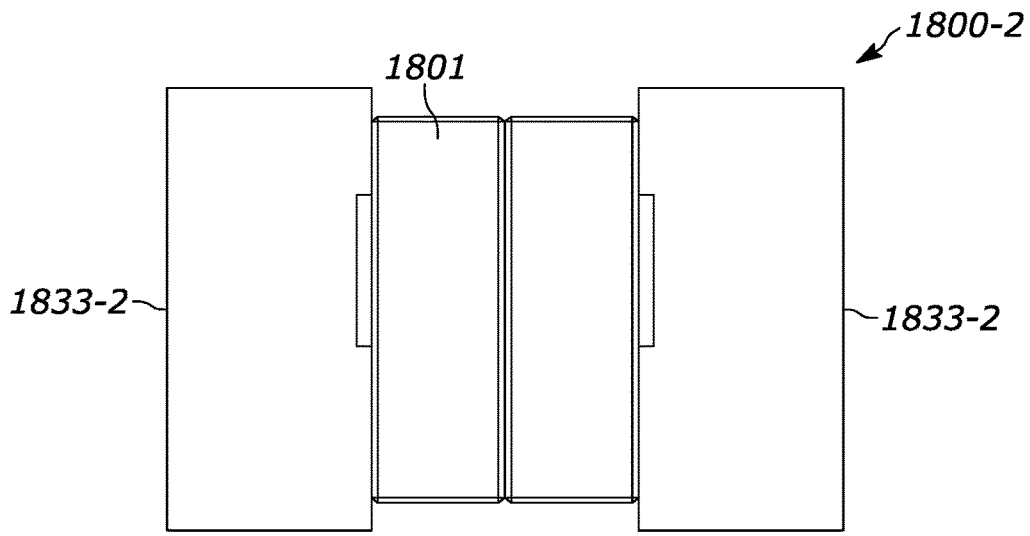
Figure 17C:
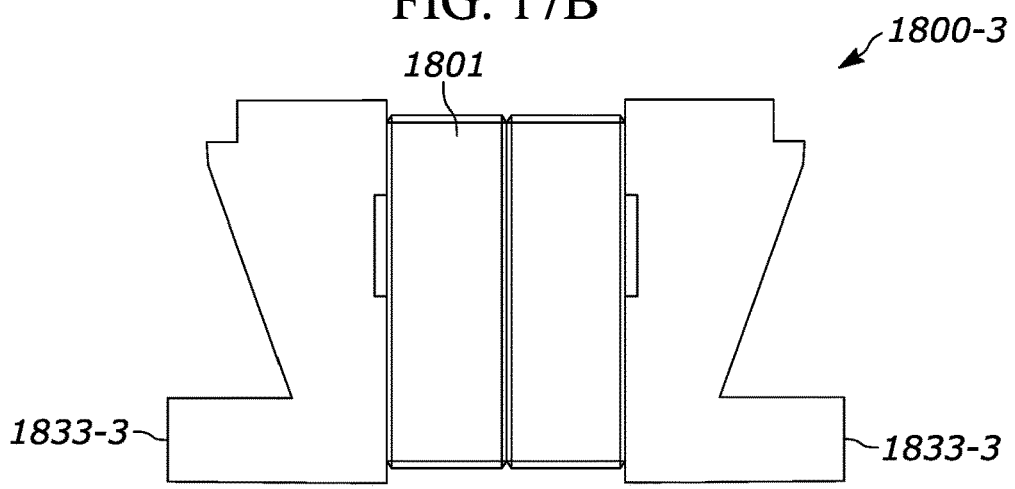

FIG. 17A, FIG. 17B, and FIG. 17C respectively depict end views of electromagnetic machines having different mounting devices, according to non-limiting examples.

Figure 18A:
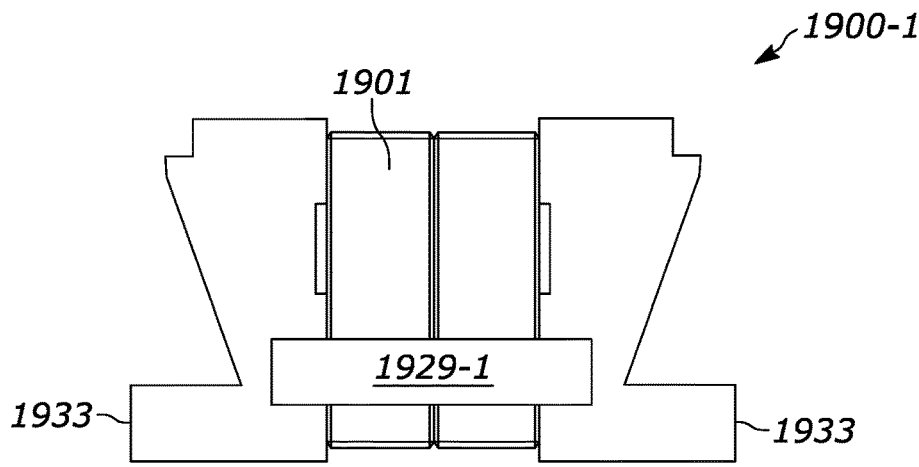
Figure 18B:
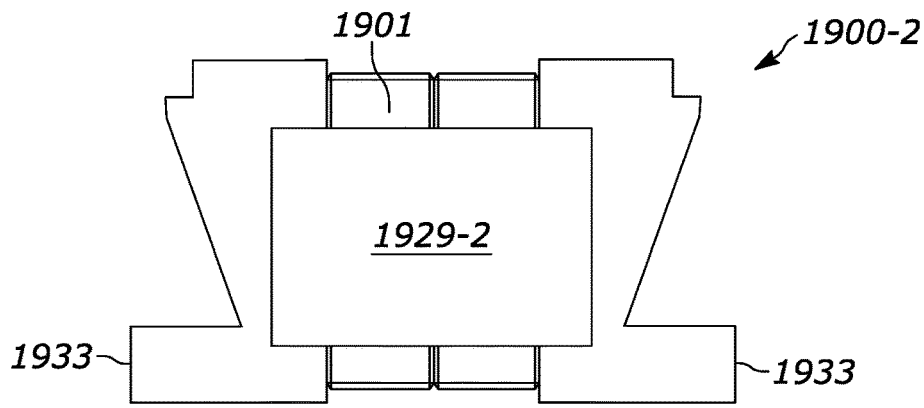
Figure 18C:
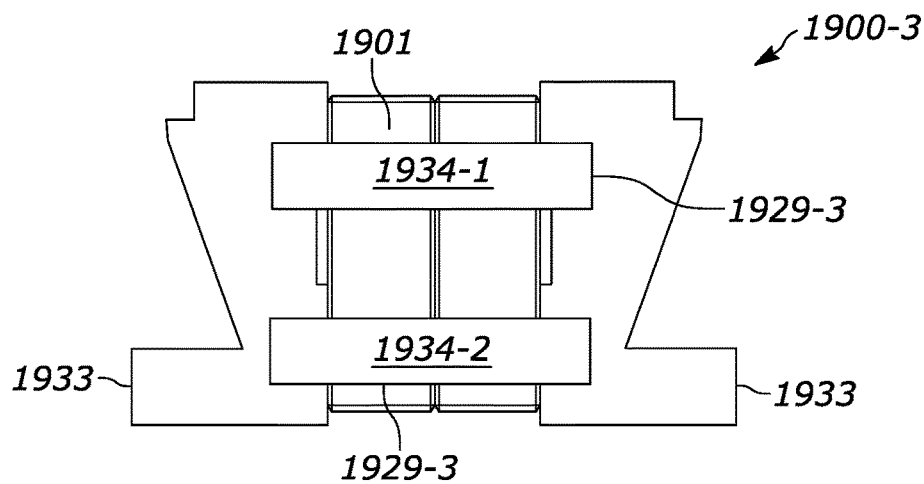

FIG. 18A, FIG. 18B, and FIG. 18C respectively depict end views of electromagnetic machines having different retention plates, according to non-limiting examples.

DETAILED DESCRIPTION

The constraints of a transportation system that seeks to promote high speed, high efficiency, and high power density, impose challenges that are not present in the state of the art. In particular, such a transportation system may include various electromagnetic machines for levitation, guidance, braking, and the like. Delays in maintenance of such electromagnetic machines may interfere with operation of the transportation system.

In particular, coils in vacuum-compatible electromagnetic actuators (e.g. electromagnetic machines) are not commonly replaceable without causing damage to the actuator assembly. This may be due to bonding, encapsulation, and other irreversible processes used during assembly. Connectors may be a vital part of a vacuum-compatible coil, wherein the connector represents a junction which would be subject to severe degradation if exposed to air/ionizable atmosphere. Coils are a component in an actuator (e.g. electromagnetic machines) which is subject to the highest stress (electrical and mechanical) in comparison to its structural strength. This means that they are likely to fail before other components of the actuator, and will have the greatest need for replacement and maintenance.

As used herein: a "Winding" may comprise a complete set of wires and coils used to conduct current in an actuator and/or an electromagnetic machine; and a "Coil" may comprise a wire wrapped around a pole portion an actuator and/or an electromagnetic machine (e.g. a winding typically having at least one coil).

Provided herein is a replaceable winding and/or winding assembly comprising components to provide electrical power to a winding disposed around a pole of an electromagnetic actuator and/or electromagnetic machine. Actuator and/or electromagnetic machines provided herein may be vacuum compatible, and each replaceable winding and/or winding assembly may be installed and removed independently without damage to other components of the actuator and/or electromagnetic machine, and/or without removing an actuator and/or electromagnetic machine that includes a replaceable winding and/or winding assembly from a pod and/or vehicle and/or payload at which the actuator and/or electromagnetic machine is mounted.

A replaceable winding and/or winding assembly provided herein may be configured in various ways; for example electrical connectors may be located at either an end-winding position and a side winding position (e.g. a primary-winding position) external to an aperture of the windings. For example, a pole of the electromagnetic actuator may be located in the aperture and/or a pole of the magnetic actuator may be immediately adjacent to the aperture and may define at least one dimension of the aperture (e.g. the aperture dimensions may be selected based on the pole dimensions). Indeed, furthermore, a replaceable winding may be disposed between neighboring poles. For example, a location and/or orientation of the electrical connectors relative to a body of an electrical winding is selected such that an electrical winding may easily be replaced at the electromagnetic actuator and/or electromagnetic machine. In examples provided herein, electrical connectors are located at end windings (a longitudinal end) of an electrical winding, as well as located at a long side of an electrical winding; however, the electrical connectors may be located at any suitable position where the electrical connectors do not obstruct poles of the electromagnetic actuator and/or electromagnetic machine, and/or the insertion/removal paths of the electrical winding onto the poles.

A replaceable winding and/or winding assembly provided herein may be retained at an electromagnetic actuator and/or electromagnetic machine in a plurality of ways. For example one or more straps may be provided which hold a replaceable winding to a removable plate and/or a cold plate, the plate and/or the cold plate being mechanically attached to the actuator and/or electromagnetic machine. The plate could have cooling functionality (e.g. a cold plate), or it may comprise ferromagnetic material and comprise a component of a magnetic pole and/or back-iron of an electromagnetic actuator and/or electromagnetic machine; alternatively the plate may comprise non-ferromagnetic material and provide electrical winding retention functionality (e.g. without cooling and/or magnetic functionality). Alternatively, bars disposed across a top of electromagnetic actuator and/or electromagnetic machine may constrain the replaceable winding and/or winding assembly in a direction of a pole portion; removable plates may be located below the replaceable winding, and the replaceable winding may be attached to the plate by various methods.

Furthermore, in the case of the end-winding connector configuration, the replaceable winding may be directly interfaced with and/or interfaced with the connectors via encapsulation that performs various functions; the encapsulation may cover all faces of the end-winding. Indeed, in the case of a primary-winding connector configuration and/or an end-winding configuration, a coil of a replaceable winding may be indirectly interfaced with and/or interfaced with a connector via leads and other components including strands of the wire comprising the coil, where the connector assembly may include encapsulation and/or another insulation system. For example, a coil of a replaceable winding may be electrically connected to the connector through wire leads and/or busbars which may be bolted, welded, soldered and/or brazed together Hence, an aspect of the present specification provides a replaceable winding for an electromagnetic machine comprising: a body having a longitudinal axis, the body comprising opposing surfaces along the longitudinal axis; an aperture through the body, between the opposing surfaces, the aperture having generally parallel internal sides about perpendicular to the opposing surfaces of the body, the aperture configured to removably received a pole portion of the electromagnetic machine; electrical conductors wound about the aperture in the body; and electrical connectors at one or more external sides of the body, the electrical connectors connected to the electrical conductors.

Another aspect of the present specification provides a ferromagnetic body extending along a longitudinal axis, the ferromagnetic body comprising: a back-iron portion; and a pole portion extending from the back-iron portion, the pole portion having parallel external sides; and a replaceable winding located on the pole portion comprising: a body along the longitudinal axis, the body being comprising opposing surfaces along the longitudinal axis; an aperture through the body, between the opposing surfaces, along the longitudinal axis, the aperture having parallel internal sides about perpendicular to the opposing surfaces of the body, the aperture configured to removably received the pole portion such that the parallel external sides of the pole portion and the parallel internal sides of the aperture are adjacent when the replaceable winding is on the pole portion; electrical conductors wound about the aperture in the body; and electrical connectors at one or more external sides of the body, the electrical connectors connected to the electrical conductors; and at least one removable retention mechanism to removably retain the replaceable winding at the pole portion.

Figure 1:
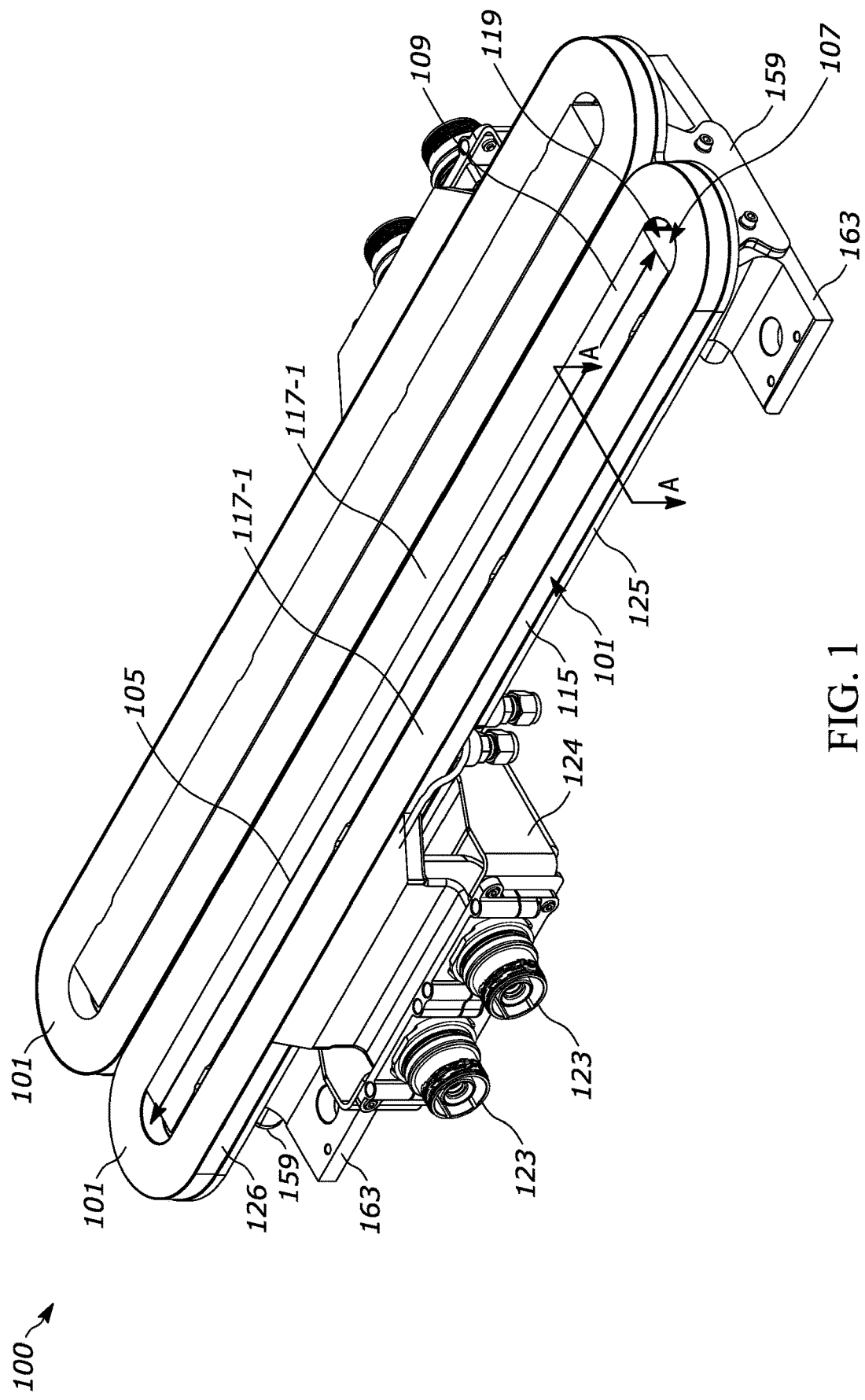
FIG. 1 depicts a perspective view of an electromagnetic machine that includes replaceable windings, according to non-limiting examples.
Figure 2:
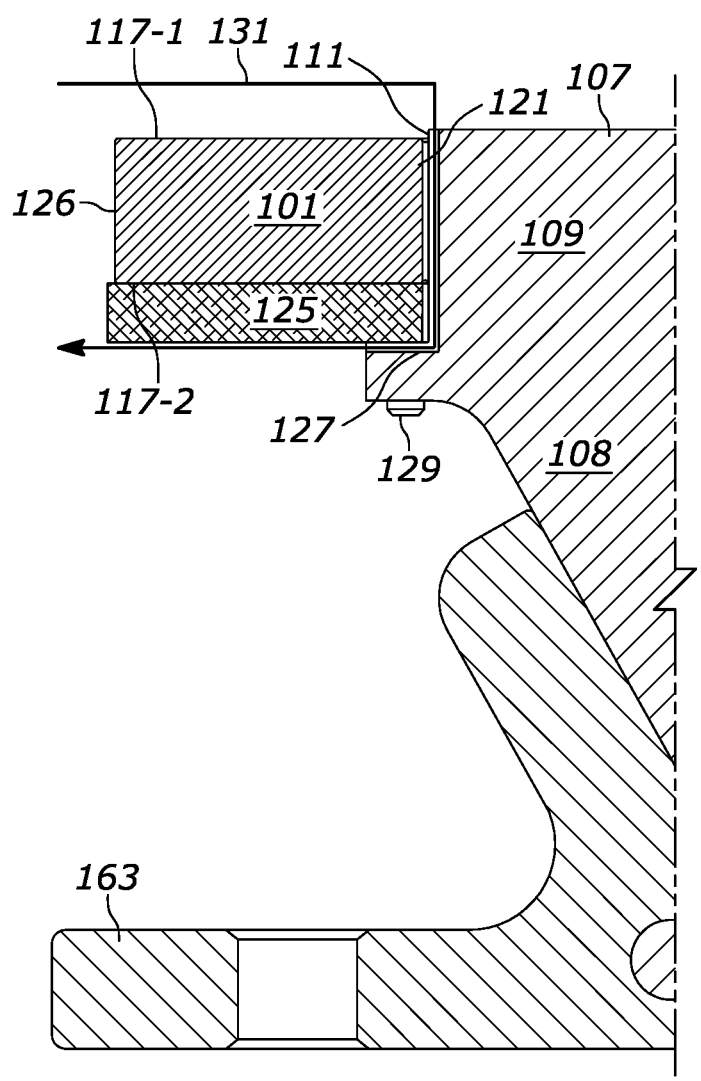
FIG. 2 depicts a partial cross-sectional view of a portion of the electromagnetic machine of FIG. 1 through the line A-A, according to non-limiting examples.

Attention is next directed to FIG. 1 and FIG. 2 which respectively depict: a perspective view of an electromagnetic machine 100 that includes replaceable windings 101; and a partial cross-sectional view of the electromagnetic machine 100 through the line A-A of FIG. 1. The electromagnetic machine 100 generally comprise an electromagnetic actuator which may be used for any suitable functionality, including, but not limited to, levitating (e.g. a levitation electromagnetic actuator), guidance (e.g. a guidance electromagnetic actuator), braking (e.g. a braking electromagnetic actuator), and the like, though the electromagnetic machine may be adapted for any suitable functionality.

One or more of the electromagnetic machines 100 and may be attached to a pod (e.g. a vehicle and/or payload, and the like), and the like, of a transportation system. For example, one or more of the electromagnetic machines 100 may be attached to a pod and/or vehicle and/or payload used in a high speed transportation system which may be deployed on land, underground, overland, overwater, underwater, and the like; a pod and/or vehicle and/or payload of the high speed transport system may comprise a vehicle, and the like, for transporting cargo and/or passengers, and the like, and/or any other suitable payloads. One or more of the electromagnetic machines 100 may interact with a track of the transportation system and/or high speed transportation system to provide electromagnetic actuation for the pod and/or vehicle and/or payload. The track may be mounted in a tube, and/or at a wall, and the like, of the transportation system which may be partially evacuated. The pod and/or vehicle and/or payload may include further electromagnetic machines for any suitable type of electromagnetic actuation, in the tube. Such further electromagnetic machines may include replaceable windings similar to the replaceable windings 101, but adapted for a geometry and/or functionality of the further electromagnetic machines. The replaceable windings 101, and the like, may become damaged and/or need replacing, and such replacement processes will be described below.

In particular, the electromagnetic machine 100 comprises: at least one ferromagnetic body 107 (a cross-section of which is best seen in FIG. 2) extending along a longitudinal axis 105, the ferromagnetic body 107 comprising: a back-iron portion 108 (as best seen in cross-section in FIG. 2); and a pole portion 109 extending from the back-iron portion 108, the pole portion 109 having parallel external sides 111 (e.g. one of which is depicted in FIG. 2).

Figure 3:
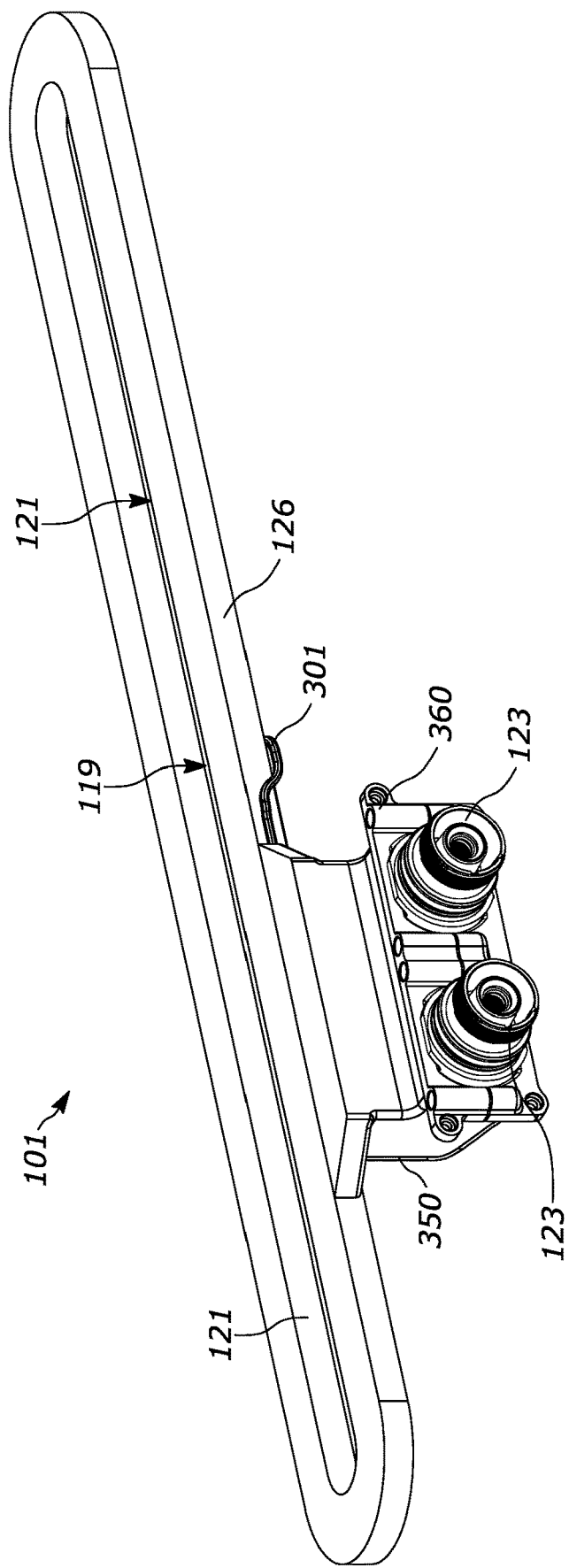
FIG. 3 depicts a perspective view of a replaceable winding of FIG. 1, with electrical connectors located at a side of the replaceable winding, according to non-limiting examples.

The electromagnetic machine 100 further comprises at least one replaceable winding 101 located on the pole portion 109, the at least one replaceable winding 101 comprising: a body 115 along the longitudinal axis 105, the body 115 comprising opposing surfaces 117-1, 117-2 along the longitudinal axis 105 (e.g. top and bottom surfaces, the bottom surface 117-2 best seen in FIG. 2); an aperture 119 through the body 115, between the opposing surfaces 117-1, 117-2, along the longitudinal axis 105, the aperture 119 having parallel internal sides 121 (e.g. as best seen in FIG. 3) about perpendicular the opposing surfaces 117-1, 117-2 of the body 115, the aperture 119 configured to removably received the pole portion 109 such that the parallel external sides 111 of the pole portion 109 and the parallel internal sides 121 of the aperture 119 are adjacent when the replaceable winding 101 is on the pole portion 109; electrical conductors (not visible but understood to be present in the body 115) wound about the aperture 119 in the body 115; and electrical connectors 123 at one or more external sides 126 of the body 115, the electrical connectors 123 connected to the electrical conductors, as described in more detail below. When the replaceable winding 101 is removed from the pole portion 109, the sides 111, 121 generally slide relative to each other.

Put another way, the pole portion 109 may be generally rectangular in cross-section and the aperture 119 may have a rectangular cross-section. In other examples, the pole portion 109 may be generally square in cross-section and the aperture 119 may have a square cross-section.

Furthermore, while as depicted, the body 115 is generally planar (e.g. and the generally parallel internal sides 121 are about perpendicular to a plane of the body 115), the body 115 may have any suitable shape. For example, the body 115 may include, but is not limited to, bends and/or steps (e.g. one or more steps) along the direction of the longitudinal axis 105. Indeed, the body 115 may have any suitable shape where the electrical winding 101 is replaceable at the electromagnetic machine 100 as described in further detail below.

In general, there may be a gap between the internal sides 121 of the aperture 119 and respective external sides 111 of the pole portions 109. Indeed, as the electrical windings 101 are removable from the pole portions 109 and/or ferromagnetic bodies 107, such a gap may provide adequate mechanical clearance between the internal sides 121 of the aperture 119 and respective external sides 111 of the pole portions 109; such clearance may further reduce and/or eliminate intimate thermal contact directly between the electrical windings 101 and the pole portions 109.

As depicted, the electromagnetic machine 100 may further comprise one or more trays 124 for removably receiving the electrical connectors 123. For example, as depicted, the electrical connectors 123 may extend laterally outward from the body 115 and/or the sides 121; indeed, as depicted, the connectors 123 are located "down" from the body 115. Hence, the tray 124 may be attached to the back-iron portion 108, for example via respective brackets and the like, to provide support for the connectors 123. The connectors 123 are generally configured to electrically connect to a power source for driving the electrical conductors in the body 115, for example to power the electromagnetic machine 100. For example, as depicted, the connectors 123 are threaded and may mate with complementary threads of a plug and/or connector of the power source.

As depicted the electromagnetic machine 100 comprises two ferromagnetic bodies 107 extending along a longitudinal axis 105, and hence two back-iron portions 108 and two pole portions 109, as well as two replaceable windings 101 on each of the pole portions 109 and two trays 124 (e.g. on a side opposite the electromagnetic machine 100 in the perspective of FIG. 1). However, for simplicity, only one of each of the ferromagnetic bodies, the back-iron portions 108 the pole portions 109, and the replaceable windings 101 are annotated. However, in other examples, the electromagnetic machine 100 may comprise as few as one ferromagnetic body 107 (e.g. and one back-iron portion 108 and pole portion 109 and one tray 124) and one replaceable winding 101. However, in yet further examples, the electromagnetic machine 100 may comprise more than two ferromagnetic bodies 107 extending along a longitudinal axis 105, and hence more than two back-iron portions 108 and more than two pole portions 109, as well as more than two replaceable windings 101 on each of the more than two pole portions 109 (e.g. and more than two trays 124). Indeed, the replaceable windings 101 and the pole portions 109 are generally provided in a one-to-one relationship.

As will be described below, the electromagnetic machine 100 further comprises at least one removable retention mechanism to removably retain a replaceable winding 101 at a respective pole portion 109.

As further depicted in FIG. 1 and FIG. 2, the electromagnetic machine 100 may comprise at least one cold plate and/or plate 125 which may provide cooling functionality. While, hereafter, references are made to a cold plate 125, the term "cold plate" may be replaced throughout with the term "plate" and/or "plate with cooling functionality". For example, a plate with, or without cooling functionality may also have electrical winding retaining functionality as described below. In some examples, the plate 125 may comprise ferromagnetic material to provide magnetic functionality to the plate 125 (e.g. the plate 125 may function as part of the ferromagnetic bodies 107). As best seen in FIG. 2, the at least one cold plate 125 may be removably retained at a ledge 127 of the back-iron portion 108 adjacent the pole portion 109 (e.g. a corner is formed by the ledge 127 and the external side 111 of the pole portion 109), the replaceable winding 101 located on the at least one cold plate 125. As depicted, the at least one cold plate 125 may be affixed to the ledge 127 via any suitable fasteners 129 (e.g. as depicted bolts, and the like)

Furthermore, a replaceable winding 101 is generally easily removable and/or replaceable at a pole portion 109. Hence, when a replaceable winding 101 is damaged and/or needs to be replaced, the retention mechanisms are removed, the replaceable winding 101 is lifted off, and/or removed from the pole portion 109, for example by virtue of the sides 111, 121 being about parallel to one another, and another replaceable winding 101 is placed over the pole portion 109, with the retention mechanisms being replaced (e.g. with the previous retention mechanisms and/or new/replacement retention mechanisms).

In FIG. 1, the electromagnetic machine 100 is depicted without retention mechanisms. However, in some examples, the retention mechanisms may comprise straps (e.g. see FIG. 7), and the like, which may comprise flexible non-ferromagnetic material, such as aluminum, and/or any suitable metal, plastic and the like. As best seen in FIG. 2, the straps may fit along a pathway 131 around the top surface 117-1 of the electrical winding 101, between the parallel sides 111, 121 (e.g. via a relief cut at a side 121 of the pole portion 109), along the ledge 127 (e.g. via a relief cut at the ledge 127) and across the cold plate 125. Such a strap may be attached to itself via any suitable connector and tightened to any suitable tension, to removably retain the replaceable winding 101 relative to the pole portion 109 and against the cold plate 125 which is in turn mechanically retained at the electromagnetic machine 100. Hence, the cold plate 125 further includes electrical winding retaining functionality (e.g. indeed, the cold plate 125 may be replaced with a plate without cooling functionality but with electrical winding retaining functionality). Hence, the at least one removable retention mechanism may comprise one or more straps around a replaceable winding 101 and at least one cold plate 125. Furthermore the electromagnetic machine 100 may comprise one or more relief cuts on external sides 111 of the pole portion 109 and the ledge 127, the one or more relief cuts configured to receive a respective strap, and are described below with respect to FIG. 4.

While as depicted the opposing surface 117-2 of the replaceable winding 101 is flat, as is a complementary surface of the at least one cold plate 125, in other surfaces the opposing surface 117-2 of the replaceable winding 101 and the complementary surface of the at least one cold plate 125 need not be flat; however, the opposing surface 117-2 of the replaceable winding 101 and the complementary surface of the at least one cold plate 125 are generally complementary. Indeed, in general, an opposing surface 117-2 of the replaceable winding 101 facing the electromagnetic machine 100 is complementary to a respective surface of the electromagnetic machine 100 on which the opposing surface 117-2 is located (e.g. in FIG. 1 and FIG. 2, the complementary surface of the at least one cold plate 125). Put another way, an opposing surface 117-2 facing the electromagnetic machine 100 may be complementary to a respective surface of the electromagnetic machine 100 at which the opposing surface 117-2 is configured to be located.

Indeed, as depicted, the opposing surfaces 117-1, 117-2 may be flat. However the opposing surfaces 117-1, 117-2 may have any suitable profile, for example compatible with a track with which the electromagnetic machine 100 interacts.

Attention is next directed to FIG. 3 which depict perspective views of the replaceable winding 101, with the electrical connectors 123 located at an external side 126 of the replaceable winding 101 (e.g. and/or the body 115). Also depicted in FIG. 3, is an electrical connection 301 from electrical conductors (e.g. which form a coil) inside the replaceable winding 101 (e.g. and/or the body 115). In particular, the electrical connection 301 is from an internal side of the aperture 119 to one of the electrical connectors 123, for example via a housing 350 of the connectors 123, within which the electrical connection connects to a first connector 123, of the electrical connectors 123. Hence, the electrical connection 301 runs along the opposing surface 117-2 (not visible in FIG. 3) While not depicted, the replaceable winding 101 further comprises a second electrical connection from an external side 126 of the replaceable winding 101 to a second connector 123, of the electrical connectors 123; however, the second electrical connection, and the connection to the second electrical connector 123, are generally located within the housing 350.

The housing 350 may be formed from any suitable insulating encapsulating material, which may include, but is not limited to, plastic, resin, and/or another suitable material. Indeed, the body 115 of the replaceable winding 101 may also generally be encapsulated with any suitable insulating encapsulating material, such as a resin.

Also depicted in FIG. 3 is a faceplate and/or frame 360 to which the electrical connectors 123 are attached, and which spaces the electrical connectors 123 from each other. The electrical connectors 123 generally extend from the frame 360.

For completeness, attention is briefly directed back to FIG. 1 which further depicts the electromagnetic machine 100 comprising retention plates 159 located at opposing longitudinal ends of the electromagnetic machine 100 to retain a magnet thereof, described in more detail below with respect to FIG. 6. Put another way, retention plates 159 may be located at opposite ends of a longitudinal axis of the electromagnetic machine 100, the retention plates 159 configured to hold a magnet between two ferromagnetic bodies 107 of the pole portions 109. In some examples, the retention plates 159 may be attached to one or more back-iron portions 108 of at least one ferromagnetic body 107 at the opposite ends of a longitudinal axis of the electromagnetic machine 100, for example via bolts, and/or any other suitable fastener.

FIG. 1 which further depicts the electromagnetic machine 100 comprising mounting devices 163, located at the opposite ends of a longitudinal axis of the electromagnetic machine 100, and which may be attached to the at least one back-iron portion 108 and/or frame (not depicted) which may assist in supporting a magnet (not depicted in FIG. 1; see FIG. 6) and/or the ferromagnetic bodies 107 and/or other components of the electromagnetic machine 100. The mounting devices 163 may be configured to attach the electromagnetic machine 100 to a pod and/or vehicle and/or payload; in some of these examples, the retention plates 159 may be attached to the mounting devices 163 at the opposite ends of a longitudinal axis of the electromagnetic machine 100. However, the retention plates 159 and/or the mounting devices 163 may be attached to any suitable component of the electromagnetic machine 100.

Figure 4:
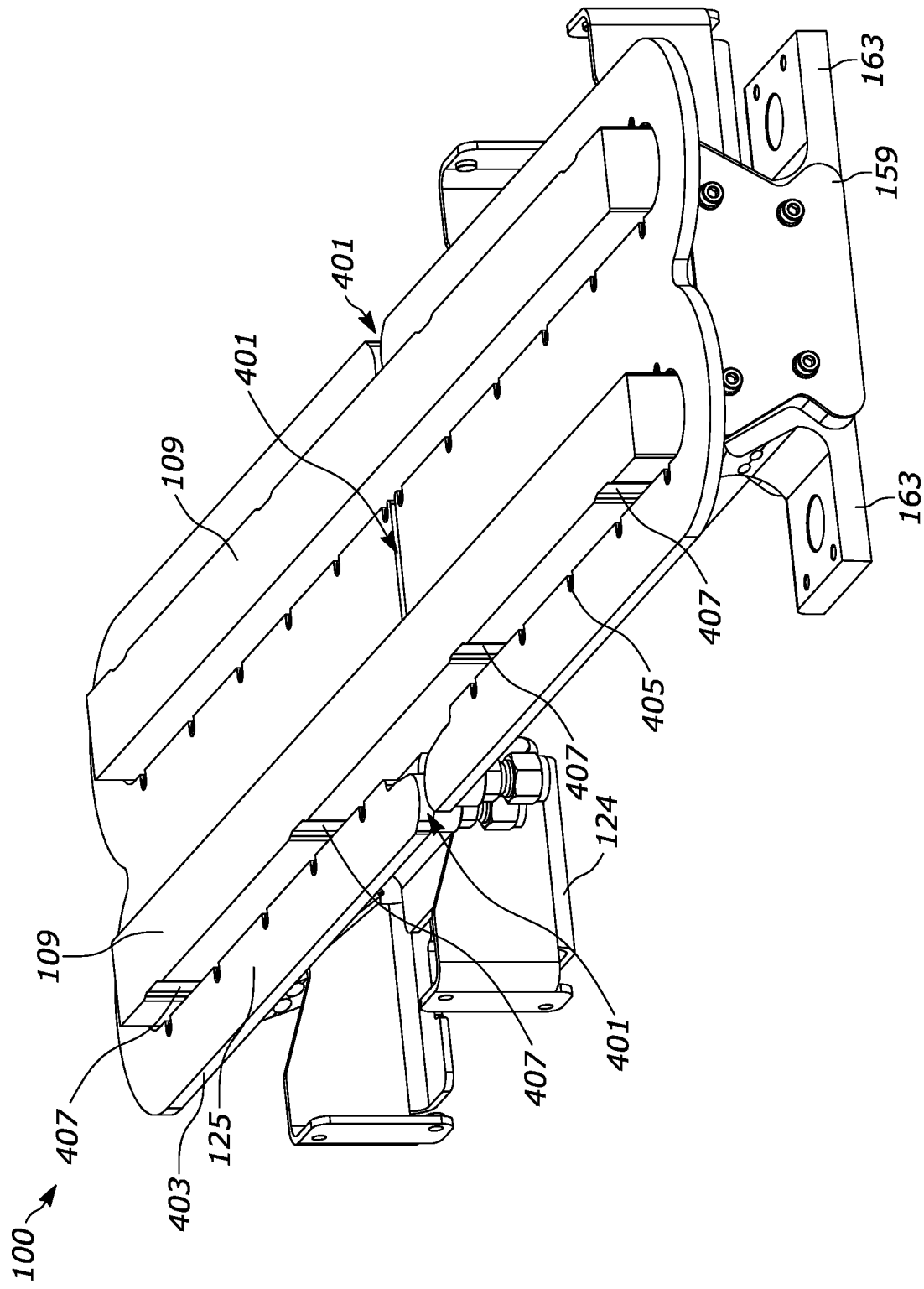
FIG. 4 depicts a perspective view of the electromagnetic machine of FIG. 1 with the replaceable windings removed, according to non-limiting examples.

Attention is next directed to FIG. 4 which depicts a perspective view of the electromagnetic machine 100 with the replaceable windings 101 removed, for example to show a structure of the at least one cold plate 125. In particular, as depicted, the at least one cold plate 125 comprises two cold plates 125 around the two pole portions 109, each of the cold plates 125 being a "W" shape and/or an "M" shape and/or an "E" shape.

In particular the at least one cold plate 125 (and/or the plate 125) comprises a gap 401 extending between an external edge 403 of the at least one cold plate 125 (and/or the plate 125) and a pole portion 109 to interrupt eddy currents in the at least one cold plate 125 (and/or the plate 125) around the pole portion 109. Indeed, as depicted, the gap 401 is formed where the two cold plates 125 meet and/or are closest to each other and/or extend towards each other (e.g. the term "meet" is not meant to imply that the two cold plates 125 touch). Put another way, the at least one plate 125 comprises a gap 401 disposed along a direction substantially perpendicular to a flow of current in a coil in the body 115, such that the at least one plate 125 is not contiguous around the pole portion 109. Put yet another way, the at least one plate 125 comprises a gap 401, such that the at least one plate 125 is discontinuous around the pole portion 109. Put yet another way, the at least one plate 125 is interrupted by a gap 401 which is disposed between an external edge of the at least one plate 125 and the pole portion 109, to interrupt eddy currents in the at least one plate 125 around the pole portion 109, In FIG. 4, example positions of bolts 405 attaching the at least one cold plate 125 to the ledge 127 are also depicted.

In FIG. 4, details of the tray 124 in the absence of the electrical connectors 123 is also depicted.

FIG. 4 further depicts relief cuts 407 along on external sides 111 of the pole portion 109. While not depicted the relief cuts 407 extend along corresponding regions of the ledge 127, such that the electromagnetic machine 100 further comprises: the ledge 127 of the back-iron portion 108 adjacent the pole portion 109 (e.g. with the replaceable winding 101 located on the ledge 127); and one or more relief cuts 407 on external sides 111 of the pole portion 109 and the ledge 127. In general, the relief cuts 407 are configured to receive straps (e.g. at least one removable retention mechanism to removably retain the replaceable winding 101 at the pole portion 109). While FIG. 4 depicts four relief cuts 407 (e.g. for as many as five straps) the electromagnetic machine 100 may include more than four or fewer than four relief cuts 407. Furthermore, not all the relief cuts 407 may be provided with a strap.

Figure 5:
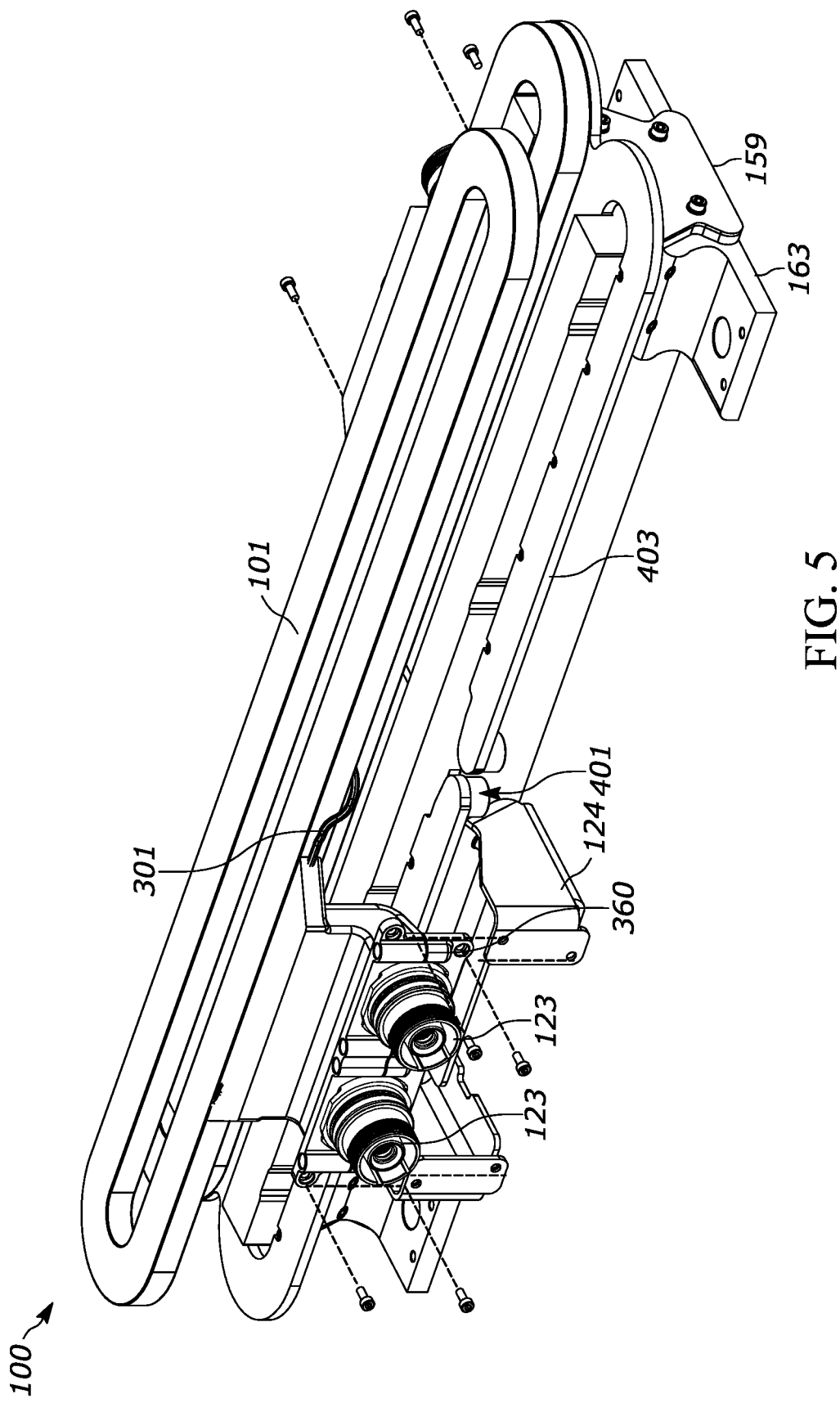
FIG. 5 depicts a partially exploded view of the electromagnetic machine of FIG. 1, according to non-limiting examples.

Attention is next directed to FIG. 5 which depicts a partially exploded view of the electromagnetic machine 100. In particular one replacement winding 101 is depicted in an exploded view which shows the position of the electrical connection 301 relative to the gap 401. Indeed, the electrical connection 301 is about aligned with the gap 401 such that when the replaceable winding 101 is on a respective pole portion 109, the electrical connection 301 is located in the gap 401.

FIG. 5 further shows the electrical connectors 123 and the frame 360 in an exploded view relative to the tray 124. In particular, it is understood from FIG. 5 that the frame 360 and the tray 124 include complementary apertures through which fasteners (e.g. as depicted bolts, and the like) may be used to attach the frame 360 (and hence the electrical connectors 123) to the tray 124.

Figure 6:
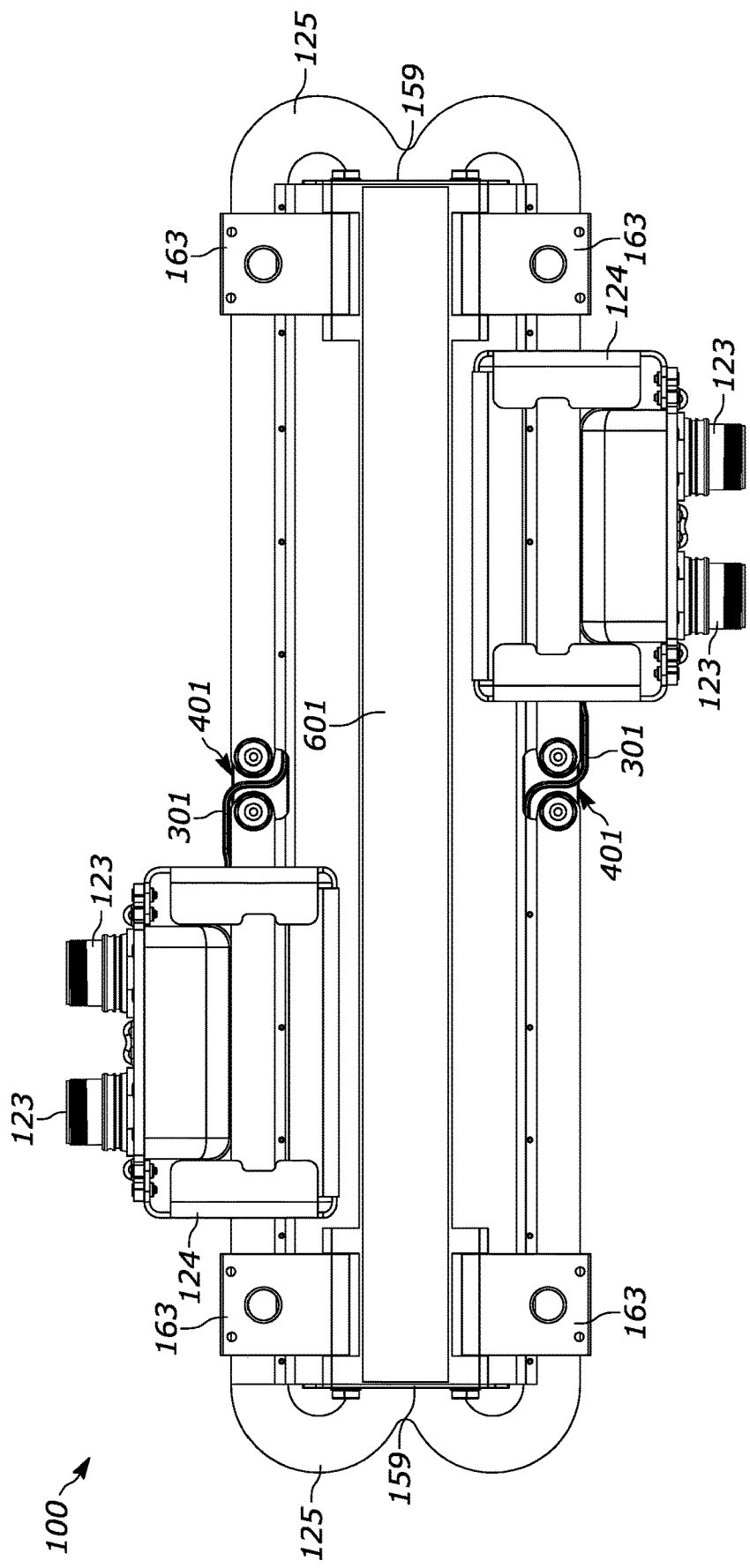
FIG. 6 depicts a bottom view of the electromagnetic machine of FIG. 1, according to non-limiting examples.

Attention is next directed to FIG. 6 which depicts a bottom view of the electromagnetic machine 100. In particular, FIG. 6 shows two sets of electrical connectors 123 supported by respective trays 124, for example a set of electrical connectors 123 for each of two replaceable windings 101 (not visible in FIG. 6). FIG. 6 depicts the location of respective electrical connections 301 of the two replaceable windings 101 in respective gaps 401 formed by the at least one cold plates 125. Put another way, FIG. 6 shows that the at least one cold plate 125 comprises a gap 401 between the external edge 403 of the at least one cold plate 125 and the pole portion 109 (not visible in FIG. 6), wherein electrical connections 301 between the electrical conductors (e.g. inside the replaceable windings 101) to the electrical connectors 123 extend from the parallel internal sides 121 of the aperture 119 through the gap 401.

FIG. 6 further depicts a bottom view of a magnet 601 which is located between the back-iron portions 108 of the ferromagnetic bodies 107 and retained between the retention plates 159. However, the magnet 601 may be optional depending on a particular function and/or magnetic operation of an electromagnetic machine. Furthermore, while the magnet 601 is depicted as one piece, the magnet 601 may be segmented. For example, the magnet 601 may comprise a plurality of segments of magnetic material (e.g. magnetic segments). The magnetic segments may be retained relative to each other via magnetic attraction therebetween, and/or via retention devices (e.g. of a frame of the electromagnetic machine 100, described in more detail below). Such a configuration may reduce cost as producing many smaller segments of magnetic material may be less expensive, with fewer rejects, than when producing one larger magnet. However, as depicted, the magnet 601 may also comprise a solid, and/or non-segmented, magnet.

Figure 7:
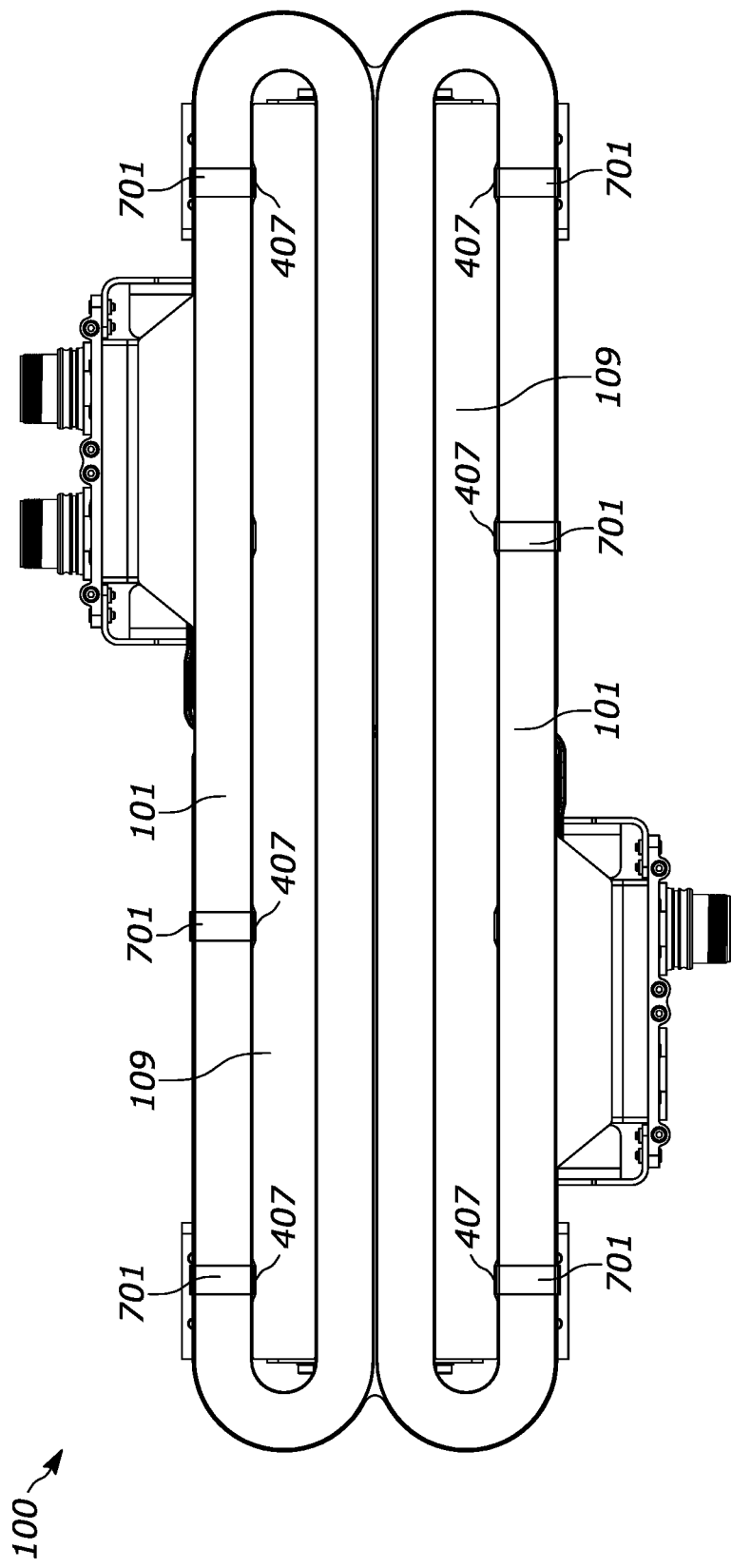
FIG. 7 depicts a top view of the electromagnetic machine of FIG. 1, according to non-limiting examples.

Attention is next directed to FIG. 7 which depicts a top view of the electromagnetic machine 100. In particular, in FIG. 7, retention mechanisms 701 have been provided to removably retain the replaceable windings 101 at respective pole portion 109. For example, as depicted, the retention mechanisms 701 comprise respective straps which are locations of respective relief cuts 407 (e.g. a strap is located in a respective relief cut 407, which may have a shape that is generally complementary to a strap). As depicted, three straps are around each of the replaceable windings 101 (e.g. and around the at least one cold plate 125, not visible in FIG. 7). For example, while there are four relief cuts 407 at a pole portion 109, only three relief cuts 407 are used for straps.

To remove a replaceable winding 101, the straps may be cut and/or removed and/or detached from themselves; the replaceable winding 101 is lifted off, and/or removed from a pole portion 109, for example by virtue of the sides 111, 121 being about parallel to one another; and another replaceable winding 101 is placed over the pole portion 109, with the straps being replaced. In some examples, the straps may be positioned in the relief cuts 407 prior to the other replaceable winding 101 is placed over the pole portion 109. In other examples, a radius of curvature of the relief cut 407, as it extends from the pole portion 109 to the ledge 127, may be selected to be of a size such that a strap slides between the other replaceable winding 101 and the pole portion 109, and along the ledge 127. Similarly, a corresponding radius may be provided at corresponding corners of the cold plates 125.

Heretofore, the electrical connectors 123 have been described as being located at a side of the body 115 about parallel to the longitudinal axis 105.

However, attention is next directed to FIG. 8 which depicts a perspective view of replaceable windings 801, having a body 815 and a longitudinal axis 816, with electrical connectors 823 located at a longitudinal end. Indeed, the replaceable winding 801 is similar to the replaceable winding 101, but the electrical connectors 823 are located at a longitudinal end of the replaceable winding 801 (e.g. in an end-winding configuration) rather than along a side (e.g. in a primary-winding configuration) as with the replaceable winding 101. As depicted, electrical connections from a coil located in the body 815 to the electrical connectors 823 are located in a housing 850 (e.g. an insulating encapsulating housing) of the connectors 823, which are held in place via a faceplate and/or frame 860. The housing 850 and the frame 860 may otherwise be similar to the housing 350 and the frame 360, but adapted for the geometry of the replaceable winding 801.

Indeed, the replaceable winding 801 is generally otherwise similar to the replaceable winding 101; however, at the replaceable winding 801, the electrical connectors 823 are located at an end of the body 815 about perpendicular to the longitudinal axis 816 (e.g. an end-winding position).

Attention is next directed to FIG. 9A, FIG. 9B, and FIG. 9C which perspective views of the replaceable winding 801 at an electromagnetic machine 900.

In FIG. 9A, the electromagnetic machine 900 is depicted without replaceable winding 801. The electromagnetic machine 900 includes: a ferromagnetic body 903 extending along a longitudinal axis 905, the ferromagnetic body comprising 903: a back-iron portion 907; and a pole portion 909 extending from the back-iron portion 907, the pole portion 909 having parallel external sides 911. As also depicted in FIG. 9A, the electromagnetic machine 900 comprises relief cuts 913 in the external sides 911. As depicted, the electromagnetic machine 900 includes a ledge 927 of the back-iron portion 907 and corresponding relief cuts 933 at the ledge 927 that extend from a respective relief cut 913 to an outer side 941 of the back-iron portion 907; such relief cuts 913, 933 may be on either side of the electromagnetic machine 900 (e.g. on either side of the longitudinal axis 905).

FIG. 9A further depicts a tray 954 for receiving and/or supporting the electrical connectors 823, the tray 954 extending from a longitudinal end of the electromagnetic machine 900.

With reference to FIG. 9B, one or more strap retainers 963 may be removably attached in corresponding relief cuts 933 at the ledge 927 using, for example bolts, screws, and the like. For example, in these examples, the electromagnetic machine 900 comprises at least one removable retention mechanism 971, such as straps, to removably retain a replaceable winding 801 at the pole portion 909. The one or more strap retainers 963 generally comprise ferromagnetic material (e.g. a same ferromagnetic material as a pole portion 909) such that the one or more strap retainers 963 may magnetically function as part of a pole portion 909.

The one or more strap retainers 963 may be plates, and the like, of a size and shape to mate with a corresponding relief cut 933, and having a groove, and the like, on a ledge facing side for a strap to fit between a strap retainer 963 and a corresponding relief cut 933. However, such strap retainers 963 are not generally attached to a corresponding relief cut 933 before a corresponding strap is placed in the corresponding relief cut 933. For example, to attach the replaceable winding 801 to the electromagnetic machine 900, straps are placed in the relief cuts 933, the strap retainers 963 are attached to corresponding relief cut 933 using bolts, screws, and/or any suitable fastener, and the like, the replaceable winding 801 is placed over the pole portion 909, and the straps are then wrapped around the replaceable winding 801, tightened, and attached to themselves (e.g. using any suitable connector).

Indeed, FIG. 9C depicts the replaceable winding 801 over the pole portion 909 with four retention mechanisms 971 (e.g. the straps) used to attach retain the replaceable winding 801 relative to the pole portion 909. When the replaceable winding 801 is to be removed, the straps are cut and/or unattached from themselves, which releases the replaceable winding 801, and the replaceable winding 801 is lifted off of the pole portion 909 (e.g. and replaced by another replaceable winding 801).

Hence, the electromagnetic machine 900 comprises: a ledge 927 of the back-iron portion 907 adjacent the pole portion 909, the replaceable winding 801 located on the ledge 927; one or more relief cuts 913, 933 on external sides 911 of the pole portion 909 and the ledge 927; and one or more strap retainers 963 removable attached in corresponding relief cuts 933 at the ledge 927, the at least one removable retention mechanism 971 comprising one or more straps around the replaceable winding 801 and the one or more strap retainers 963, the one or more relief cuts 913, 933 configured to receive a respective strap. While four removable retention mechanisms 971 (e.g. straps) and corresponding relief cuts 913, 933 and strap retainers 963 are depicted (e.g. two per side), the electromagnetic machine 900 may comprise more than four or fewer than four removable retention mechanism 971 (e.g. straps) and corresponding relief cuts 913, 933 and strap retainers 963.

FIG. 9C further depicts the electrical connectors 823 retained by the tray 954.

Attention is next directed to FIG. 10A which depicts four of the electromagnetic machines 900 ganged together and/or attached to each other, such that their respective pole portions 909 are parallel to each other. As depicted, for example, the four electromagnetic machines 900 are labelled as an electromagnetic machine 900-1, an electromagnetic machine 900-2, an electromagnetic machine 900-3, and an electromagnetic machine 900-4. In particular, the electromagnetic machines may be ganged together and/or attached to each other via any suitable fasteners, and the like, and/or mounted on a common support.

As depicted, the electromagnetic machine 900-3 has had a respective replaceable winding 801 removed, for example by cutting and/or detaching respective straps. Hence, the strap retainers 963 of the electromagnetic machine 900-3 are visible in FIG. 10A.

Alternatively, with reference to FIG. 10B, which depicts a portion of an electromagnetic machine 900B without replaceable windings 801, a plurality of the electromagnetic machines 900 may include a common back-iron portion 927B (e.g. provided as a single slab of ferromagnetic material, from which any suitable number of respective core portions 909B-1, 909B-2, 909B-3, 909B-4, extend. Relief cuts 913B in sides of the respective core portions 909B-1, 909B-2, 909B-3, 909B-4, are also depicted, as well as relief cuts 933A for receiving strap retainers (e.g. such as a strap retainer 963). Replaceable windings 801 may be placed onto each of the core portions 909B-1, 909B-2, 909B-3, 909B-4, similar to as depicted in FIG. 10A, and retained via straps using the relief cuts 913B and the strap retainers 963 in the relief cuts 933A. Indeed, the core portions 909B-1, 909B-2, 909B-3, 909B-4, the relief cuts 913B, 933A are similar to respective core portions, and the relief cuts 913, 933 as described above.

Attention is next directed to FIG. 11A and FIG. 11B which respectively depict a cross-sectional side view and a cross-sectional partially exploded view of another electromagnetic machine 1100 with a replaceable winding 1101 and which may be used as an electromagnetic actuator. As depicted, the electromagnetic machine 1100 comprises a ferromagnetic body 1107 extending along a longitudinal axis 1105 (e.g. into and/or out of the page of FIG. 11A and FIG. 11A), the ferromagnetic body 1107 comprising: a back-iron portion; and a pole portion 1109 extending from the back-iron portion 1108, the pole portion 1109 having parallel external sides. The replaceable winding 1101 is over the pole portion 1109 (as best seen in FIG. 11A), similar to the electromagnetic machines described heretofore, and the replaceable winding 1101 is sandwiched between cold plates 1125. Also depicted are electrical connectors 1123 (e.g. of two electrical connectors 1123, similar to the electrical connectors 123). However, at least one of the cold plates 1125 may be optional.

In contrast to electromagnetic machines described heretofore, a removable retention mechanism 1171 of the electromagnetic machine 1100 comprises at least one ferromagnetic retainer, for example in the shape of a bar, removably attached to an external surface 1172 of the pole portion 1109, for example via one or more fastener 1173 (e.g. at least a partially threaded fastener) through an aperture of the retention mechanism 1171 that mate with respective holes 1174 (e.g. at least a partially threaded hole), and the like, in the external surface 1172 of the pole portion 1109. As best seen in FIG. 11A, the ferromagnetic retainer (e.g. the removable retention mechanism 1171) extends at least partially across an outward opposing surface of the replaceable windings 1101; in particular, as depicted, a cold plate 1125 is between the ferromagnetic retainer and the outward opposing surface of the replaceable windings 1101. Hence, for example, the removable retention mechanism 1171 may be of similar ferromagnetic material as the ferromagnetic body 1107, and attached to the external surface 1172 of the pole portions 1109 using the at least one fastener 1173 (e.g. screws, bolts, and the like), and which may also be ferromagnetic, and which mechanically retain the replaceable winding 1101 on the pole portion 1109. As best seen in FIG. 11B, one or more pins 1175 extending from a pole facing side of the retention mechanism 1171 (and/or one or more pins 1176 external surface 1172 of the pole portion 1109) may assist with retaining the retention mechanism 1171 in position relative to the pole portion 1109. For example such pins 1175 may mate with respective holes in the cold plate 125 and/or the external surface 1172 of the pole portion 1109, and/or pins 1176 extending from the external surface 1172 of the pole portion 1109 and/or the cold plate 125 may mate with respective holes in the pole facing side of the retention mechanism 1171.

While the retention mechanism 1171 is depicted as rectangular in cross-section, the retention mechanism 1171 may have any suitable shape and may be as simple as bars (e.g. as depicted), rods, and the like, which extend from the external surface 1172 of the pole portion 1109 and at least partially across an outward opposing surface of the replaceable winding 1101 (e.g. and/or the cold plates 1125).

FIG. 11B further shows removable of the replaceable winding 1101. In particular, the removable retention mechanisms 1171 are removed (e.g. by removing the one or more fasteners 1173) which enables the adjacent cold plate 125 to be removed (e.g. which may be optional), and then the replaceable winding 1101 may be lifted off the pole portion 1109 (e.g. presuming a frame of the connectors 1123, not depicted, are also unattached from a tray, not depicted). The process may be reversed to place a new replaceable winding 1101 onto the electromagnetic machine 1100.

Other examples and/or embodiments are within the scope of the present specification.

For example, attention is next directed to FIG. 12A, FIG. 12B, FIG. 12C, and FIG. 12D which depict examples of portions of electromagnetic machines 1300-1, 1300-2, 1300-3, 1300-4 having retention mechanisms different from the retention mechanisms 701 (e.g. different from straps). For example, the electromagnetic machine 1300-1 comprises one or more retention mechanisms 1328-1, the electromagnetic machine 1300-2 comprises one or more retention mechanisms 1328-2, the electromagnetic machine 1300-3 comprises one or more retention mechanisms 1328-3, and the electromagnetic machine 1300-4 comprises one or more retention mechanisms 1328-4A, 1328-4B.

The electromagnetic machines 1300-1, 1300-2, 1300-3, 1300-4 are interchangeably referred to hereafter, collectively, as the electromagnetic machines 1300 and, generically, as an electromagnetic machine 1300. This convention will be used hereafter. For example, the retention mechanisms 1328-1, 1328-2, 1328-3, 1328-4A, 1328-4B are referred to hereafter as the retention mechanisms 1328 and/or as a retention mechanism 1328.

To better show details of the retention mechanisms 1328, in each of FIG. 12A, FIG. 12B, FIG. 12C, and FIG. 12D, a respective left hand side shows a top view of an end of an electromagnetic machine 1300, with electrical connectors (e.g. similar to the connectors 123), removed while a respective right hand side shows an end view of an electromagnetic machine 1300, with retention plates (e.g. similar to the retention plates 159) removed.

As depicted, the electromagnetic machines 1300 comprise respective magnets 1301, respective pole portions 1309, respective electrical windings 1313 around the respective pole portions 1309, and cold plates 1317, which are respectively similar to magnet 601, the pole portions 109, the electrical windings 101 and cold plates 125 of the electromagnetic machine 100. However, as depicted, the magnets 1301 are segmented. Similarly, as will next be described, the retention mechanisms 1328 are different from the retention mechanisms 701. The electromagnetic machines 1300 are understood to be otherwise similar to the electromagnetic machine 100.

While in the depicted examples, only one respective retention mechanism 1328 is depicted at each of the electromagnetic machines 1300, for example at one respective end thereof, it is understood that an electromagnetic machine 1300 may comprise any suitable number of respective retention mechanisms 1328. For example, the electromagnetic machines 1300 may comprise one or more respective retention mechanisms 1328 along a longitudinal axis thereof (e.g. similar to the longitudinal axis 105); in a particular example, the electromagnetic machines 1300 may comprise at least three retentions mechanisms 1328, one at each end of the pole portions 1309, and one at about the middle of the pole portions 1309.

Furthermore, the retention mechanisms 1328 may comprise any suitable material which may be electrically conducting and/or ferromagnetic, or an insulator. The retention mechanisms 1328, when ferromagnetic, may assist with shaping magnetic flux and/or a magnetic flux path (e.g. as described with respect to FIG. 2). Furthermore, a gap between an electromagnetic machine 1300 and a track (e.g. a track of a transportation system) may be maintained taking into account any additional height added to pole faces due to presence of the retention mechanisms 1328.

Furthermore, while not depicted, the retention mechanisms 1328 are understood to be attached to the electromagnetic machines 1300 using any suitable devices and/or fasteners and/or mechanisms to assist the retention mechanisms 1328 with retaining the electrical windings 1313, and optionally the cold plates, to the electromagnetic machines 1300.

Figure 12A:
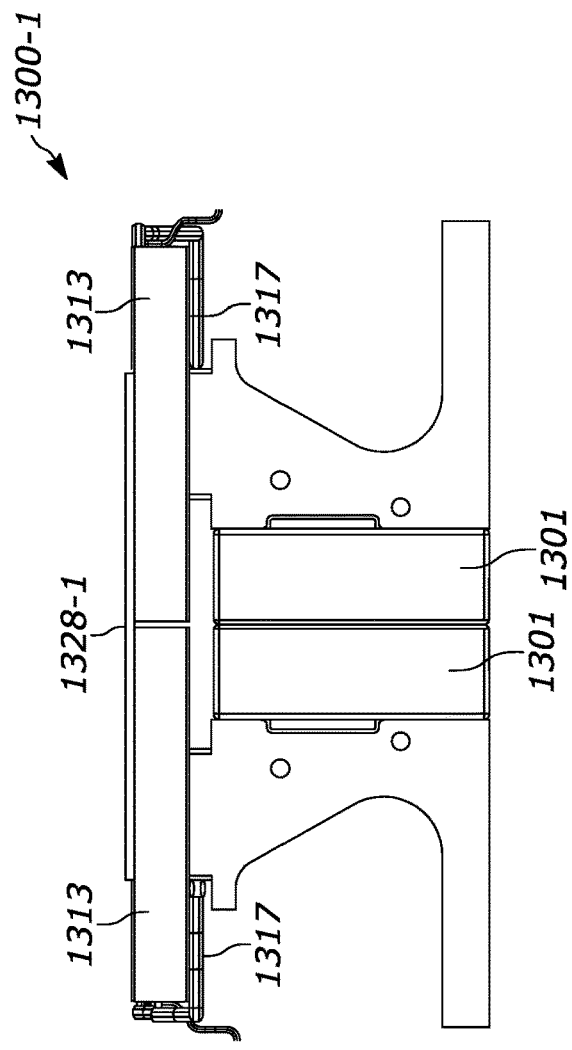
Figure 12A:
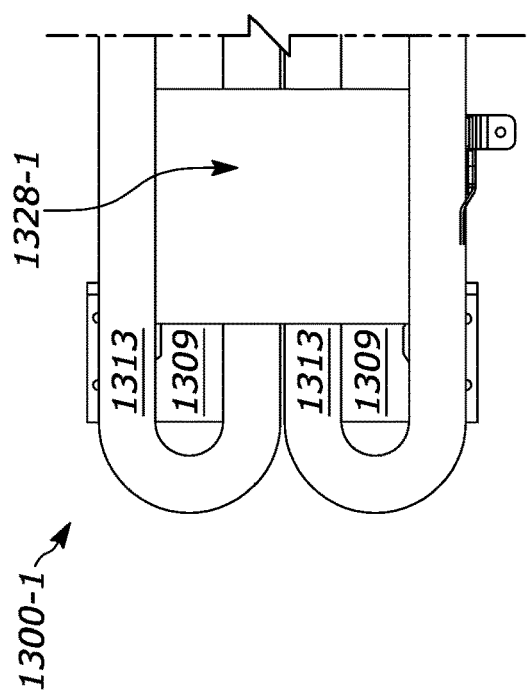

With attention next directed to FIG. 12A, the retention mechanism 1328-1 is understood to include a plate attached to respective pole faces of the pole portions 1309, and which extends across at least a portion of the electrical windings 1313. Hence, for example, the retention mechanism 1328-1 is understood to be attached to both pole portions 1309 and across the electrical windings 1313 between the pole portions 1309. Furthermore, while as depicted the retention mechanism 1328-1 is square in shape, the retention mechanism 1328-1 may have any suitable shape.

Figure 12B:
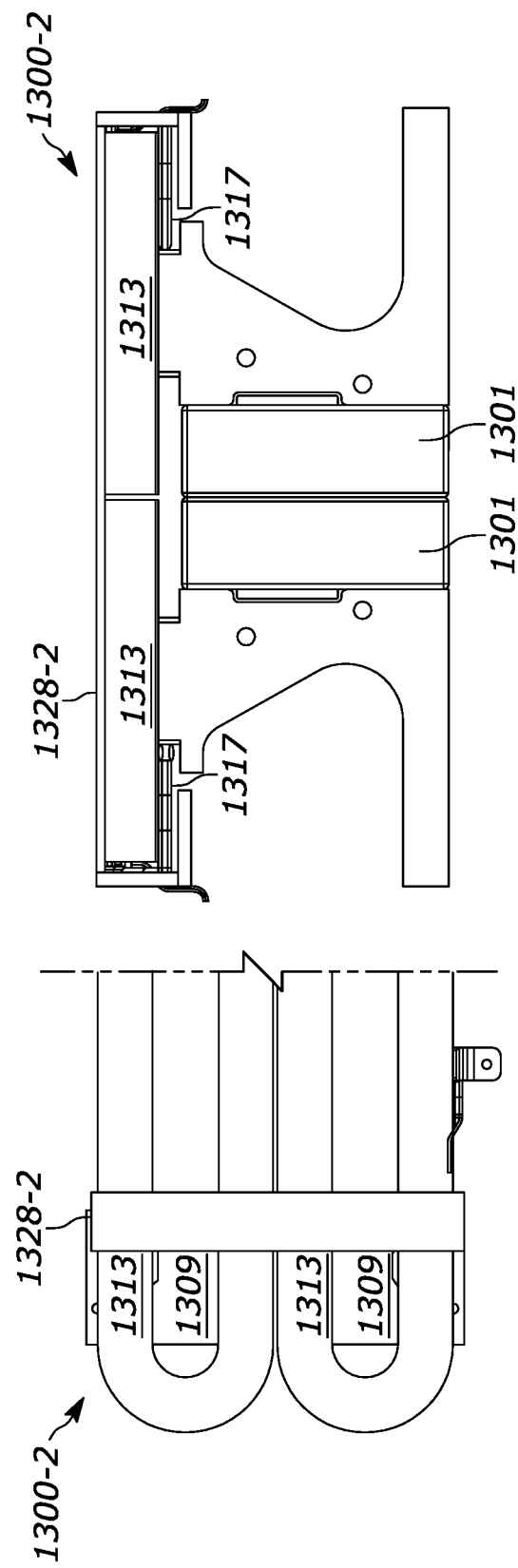

Attention next directed to FIG. 12B, which depicts a retention mechanism 1328-2 of the electromagnetic machine 1300-2 similar to the retention mechanisms 701 and/or the retention mechanism 1328-1. As depicted, the retention mechanism 1328-2 perpendicularly extends between the cold plates 1317, and in particular from under the cold plates 1317, and around sides of the electromagnetic machine 1300-2, over the electrical windings 1313 and the pole portions 1309. Like the retention mechanism 1328-1, it is understood that the retention mechanism 1328-2 may be attached to the pole portions 1309, and/or any other suitable portion of the of the electromagnetic machine 1300-2 using any suitable fasteners, and/or other suitable mechanism.

Figure 12C:
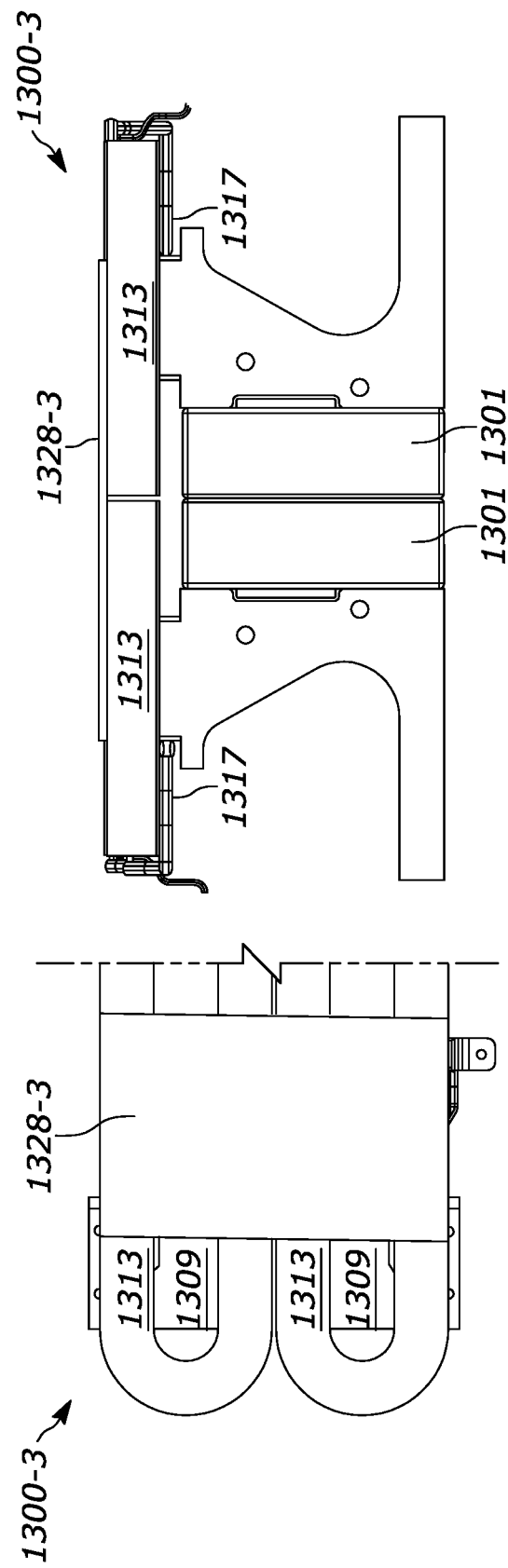

Attention next directed to FIG. 12C, which depicts a retention mechanism 1328-3 of the electromagnetic machine 1300-3, similar to the retention mechanism 1328-1, but extending from side-to-side across the electromagnetic machine 1300-3. As depicted, the retention mechanism 1328-2 perpendicularly extends across outer edges of the electrical windings 1313 and across the pole portions 1309. Like the retention mechanism 1328-1, it is understood that the retention mechanism 1328-3 may be attached to the pole portions 1309. Furthermore, while as depicted the retention mechanism 1328-3 is rectangular in shape, the retention mechanism 1328-3 may have any suitable shape.

Figure 12D:
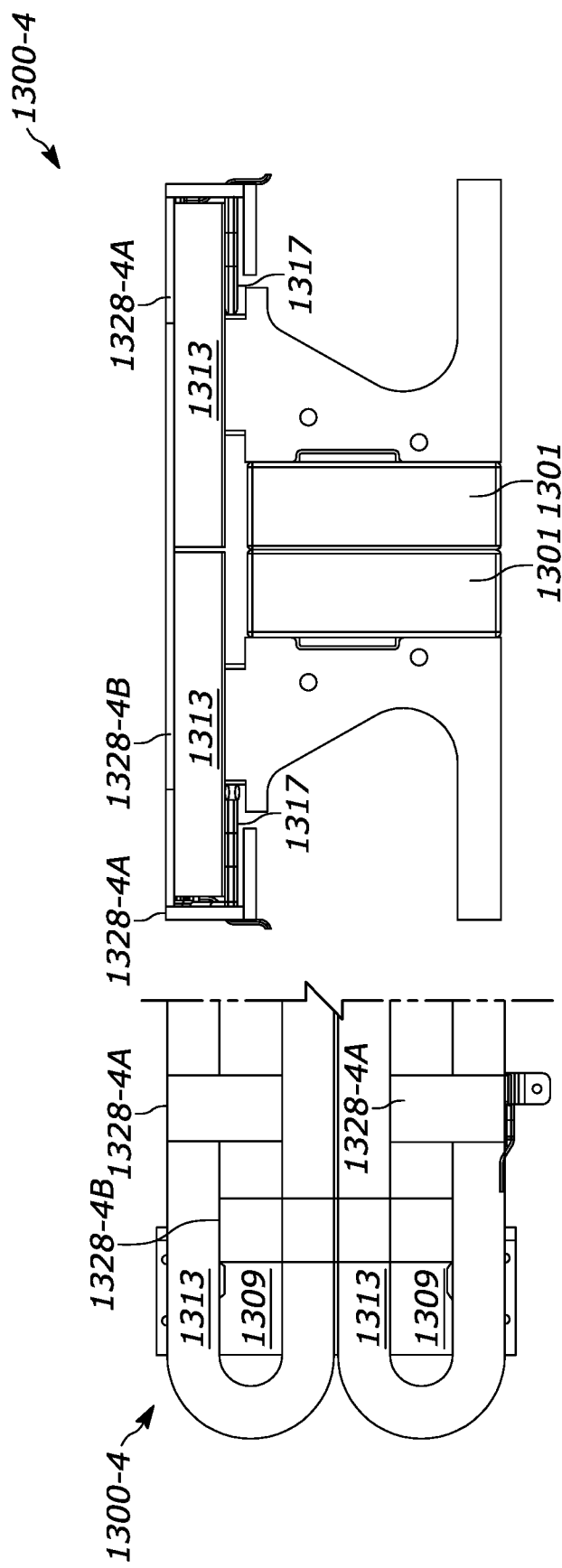

Attention next directed to FIG. 12D, which depicts retention mechanisms 1328-4A, 1328-4B of the electromagnetic machine 1300-4. At the depicted end of the electromagnetic machine 1300-4, there is one retention mechanism 1328-4A and two retention mechanisms 1328-4B, one at each opposing outer edge of respective electrical windings 1313. The retention mechanism 1328-4A is similar to the retention mechanism 1328-1, but is narrower in shape, and is understood to be attached to both pole portions 1309 and across the electrical windings 1313 between the pole portions 1309. As depicted, the retention mechanisms 1328-4B may be similar to the retention mechanisms 701 and/or the retention mechanism 1328-2; however, a retention mechanism 1328-4B may perpendicularly extend from under one cold plate 1317, and around a respective side of the electromagnetic machine 1300-4 and, over respective electrical windings 1313 to a respective pole portion 1309. The retention mechanisms 1328-4A, 1328-4B may be attached to the pole portions 1309, and/or any other suitable portion of the of the electromagnetic machine 1300-4 using fasteners and/or any other suitable mechanism.

Furthermore, while some retention mechanisms 1328 are depicted as extending across outer edges of the electrical windings 1313 and/or extending fully across the pole portions 1309, the retention mechanisms 1328 may extend only partially across the electrical windings 1313 and/or only partially across the pole portions 1309, as long as the electrical windings 1313 are retained, and/or be of any suitable shape and/or configuration such that the electrical windings 1313 are retained.

FIG. 12A, FIG. 12B, FIG. 12C, and FIG. 12D hence generally illustrate that electrical windings of the electromagnetic machines provided herein may be retained using any suitable combination of retention mechanisms configured to retain electrical windings around pole portions thereof. Furthermore, such retention mechanisms may be removable in order to replace the electrical windings of the electromagnetic machines provided herein.

Retention mechanisms provided herein may be adapted in other ways. For example, attention is next directed to FIG. 13A and FIG. 13B which respectively depict top views of electromagnetic machines 1400-1, 1400-2 (e.g. electromagnetic machines 1400 and/or an electromagnetic machine 1400), with electrical windings, and other components removed, to show a respective segmented magnet 1401, respective pole portions 1409 and respective retention mechanisms 1428. The electromagnetic machines 1400 are understood to be similar to one or more of the electromagnetic machines 100, 1300. The magnets 1401, respective pole portions 1409 and retention mechanisms 1428 are understood to be respectively similar to the magnet 1301, respective pole portions 1309 and retention mechanism 1328-1, however, the electromagnetic machines 1400 may comprise any suitable retention mechanisms.

In particular, FIG. 13A and FIG. 13B further depict that the electromagnetic machines 1400 comprise three respective retention mechanisms 1428, one at each end of the pole portions 1409, and one at about the middle of the pole portions 1409, however the electromagnetic machines 1400 comprise any suitable number of respective retention mechanisms 1428.

In particular, as depicted, the retention mechanisms 1428 of the electromagnetic machine 1400-1 are understood to be electrically connected and/or bonded to the pole portions 1409 at a respective single "point" and/or region (e.g. which may be referred to as single-point grounding/bonding). For example, as depicted, the retention mechanisms 1428 of the electromagnetic machine 1400-1 are electrically connected and/or bonded to the pole portions 1409 at respective single points 1450 (e.g. which may comprise areas and/or regions rather than merely a point), for example using a fastener (e.g. a screw and/or bolt) that is electrically conducting. While any other suitable fasteners, such as screws, bolts, and the like, may be used to otherwise physically attach the retention mechanisms 1428 of the electromagnetic machine 1400-1 to the pole portions 1409, it is understood that such other fasteners do not electrically connect the retention mechanisms 1428 to the pole portions 1409. For example, fasteners at the single points 1450 may comprise electrically conducting material, whereas other fasteners, not at the single points 1450, may comprise non-electrically conducting material and/or electrically insulating material, and/or the other fasteners may be used in conjunction with non-electrically conducting and/or electrically insulating material washers, inserts, and the like. It is understood that any suitable combination of devices may be used to physically attach the retention mechanisms 1428 to the pole portions 1409, while also electrically isolating the retention mechanisms 1428 from the pole portions 1409 other than at the respective single points 1450. Furthermore, a pole portion facing aside of the retention mechanisms 1428 may comprise an electrically insulating layer to further electrically isolate the retention mechanisms 1428 from the pole portions 1409 (e.g. other than at the single points 1450)

Such an arrangement generally enables the retention mechanisms 1428 of the electromagnetic machine 1400-1, which may be electrically conducting, to be at a same and/or similar electrical potential as the pole portions 1409 and the other conducting components electrically connected to the pole portions 1409 (e.g. the magnet 1401), to dissipate charge and/or electrical coronas, while also reducing eddy currents between the retention mechanisms 1428 and the pole portions 1409. For example, as depicted, respective arrows 1451 that extend from the single points 1450, represent eddy currents that are contained at a retention mechanism 1428 and do not extend into the pole portions 1409.

In contrast, the retention mechanisms 1428 of the electromagnetic machine 1400-2 are understood to be to be electrically connected and/or bonded to the pole portions 1409 at a respective points 1460 and/or at a plurality of locations, for example at eight points per retention mechanism 1428. Such multiple points of electrical connection allow eddy currents, represented by arrows 1461, to flow between the retention mechanisms 1428 of the electromagnetic machine 1400-2 via the pole portions 1409. Hence, there may be a reduction in eddy currents in the electromagnetic machine 1400-1, as compared to the electromagnetic machine 1400-2, due to the single point bonding.

While not depicted, cold plates of electromagnetic machines provided herein may also be electrically connected to other electrically conducting portions of the electromagnetic machines using single point bonding. For example, retention mechanisms provided herein, such as the retention mechanisms 1328, 1428 may be electrically insulated from respective cold plates and such cold plates may be single point bonded to respective pole portions, or back-iron portions and the like. Alternatively, retention mechanisms provided herein, such as the retention mechanisms 1328, 1428 may be electrically insulated from respective pole portions and back-iron portions, and respective cold plates may be single point bonded to respective retention mechanisms. Indeed, any suitable combination of electrically conducting components of electromagnetic machines provided herein may be adapted for single point bonding and/or to reduce eddy currents.

In yet further examples, electromagnetic machines provided herein may be adapted to include magnetic flux sensors.

For example, attention is next directed to FIG. 14A, FIG. 14B and FIG. 14C which respectively depict different views of an electromagnetic machine 1500. In particular, FIG. 14A shows a top view, of an end of the electromagnetic machine 1500, with electrical connectors (e.g. similar to the connectors 123) removed, FIG. 14B shows and end view of an electromagnetic machine 1500, with retention plates (e.g. similar to the retention plates 159) removed, and FIG. 14C depicts a top view of the electromagnetic machine 1500 with electrical windings, and other components removed.

As depicted, the electromagnetic machine 1500 comprises a magnet 1501, back-iron portions 1508, pole portions 1509, and electrical windings 1513 around the respective pole portions 1509, which are respectively similar to the magnet 101, the back-iron portions 108, the pole portions 109, and the electrical windings 113 of the electromagnetic machine 100. However, as depicted, the magnets 1501 are segmented.

The electromagnetic machine 1500 may be substantially similar to any other of the electromagnetic machines described herein, however, the pole portions 1509 are adapted to include one or more magnetic flux sensors 1560, for example at opposite ends thereof and/or at about a middle thereof (e.g. as best seen in FIG. 14C); hence, for example, each pole portion 1509 includes three magnetic flux sensors 1560 such that there are six magnetic flux sensors 1560 in total. While not depicted, the pole portions 1509 may include grooves and/or apertures and/or recesses, and the like, at which the magnetic flux sensors 1560 may be received.

While examples of specific locations of the magnetic flux sensors 1560 are shown, it is understood that the magnetic flux sensors 1560 are positioned at any suitable location, and an electromagnetic machine 1500 may include any suitable number of magnetic flux sensors 1560. Regardless, a magnetic flux sensor 1560 is understood to measure magnetic flux flowing about perpendicular to a respective pole portion 1509.

As such, magnetic flux in the electromagnetic machine 1500 may be monitored, for example by an external computing device 1590 (e.g. at a vehicle and, the like, to which an electromagnetic machine 1500 is attached) which receives signals from the magnetic flux sensors 1560 that represent measured magnetic flux. Power to respective electrical windings of the electromagnetic machine 1500 (e.g. via respective connectors, similar to the connectors 123) may be controlled by the computing device in a feedback loop with signals from the magnetic flux sensors 1560 to control magnetic flux in the electromagnetic machine 1500 to given values. Hence, while not depicted, the magnetic flux sensors 1560 are understood to be adapted for communicative coupling to such a computing device, for example via any suitable harnessing and/or wiring and/or data connectors of the electromagnetic machine 1500 and/or via wireless communication links (e.g. in such examples, the magnetic flux sensors 1560 may include respective transceivers for wireless communication).

Hence, as depicted in FIG. 14C, the magnetic flux sensors 1560 are understood to be communicatively coupled with a computing device 1590 (e.g. wirelessly and/or via a data connector), the computing device 1590 controlling power to the electrical windings 1513 via a power sources 1599 connected to connectors (e.g. not depicted, but similar to the connectors 123) of the electrical windings 1513. Furthermore, while the magnetic flux sensors 1560 are depicted as being both deployed on an electromagnetic machine 1500, and as being separately communicatively coupled to a computing device 1590, it is understood that the electromagnetic machine 1500 (and a vehicle thereof) comprises wiring and/or harnessing and/or communication links connecting the magnetic flux sensors 1560 to a computing device 1590. Regardless, the computing device 1590 is understood to be configured to: control power to electrical windings 1513 of the electromagnetic machine 1500 based on magnetic flux measured by the magnetic flux sensors 1560.

Put another way, an electromagnetic machine provided herein may comprise one or more magnetic flux sensors configured to measure magnetic flux of one or more pole portions, and electrical windings of the electromagnetic machine may be controllable by a computing device communicatively coupled to the one or more magnetic flux sensors, the computing device configured to control the magnetic flux in a feedback loop with the one or more magnetic flux sensors.

Furthermore, the magnetic flux sensors 1560 may be removably attached to the pole portions 1509 such that the magnetic flux sensors 1560 may be replaced. It is yet further understood that, when wiring and/or harnessing connect the magnetic flux sensors 1560 to a computing device, such wiring and/or harnessing may be attached to back-iron portions and/or routed between electrical windings and pole portions and/or routed between an end of electrical windings into an aperture thereof (e.g. similar to the aperture 119) and/or between internal sides of electrical windings and adjacent external sides of pole portions. As such, as electrical windings provided herein are removable, such routing of wiring and/or harnessing may be provided in a manner such that the electrical windings are removable without affecting and/or removing the wiring and/or harnessing and/or the magnetic flux sensors.

For example, attention is next directed to FIG. 15A and FIG. 15B which depict: an end view and a top view of an electromagnetic machine 1600 (e.g. respectively similar to the views of the electromagnetic machine 1500 in FIG. 14B and FIG. 14C). The top view in FIG. 15B shows the electromagnetic machine 1600 with electrical windings, and other components removed. The electromagnetic machine 1600 is understood to include a segmented magnet 1601, back-iron portions 1608, pole portions 1609 and electrical windings 1613 (e.g. respectively similar to the segmented magnet 1501, back-iron portions 1508, pole portions 1509 and electrical windings 1513). FIG. 15B further schematically indicates relative positions of one pair of electrical connectors 1623 (e.g. similar to the connectors 123), which are removed from FIG. 15A. Similar to the electromagnetic machine 1500, the pole portions 1609 of the electromagnetic machine 1600 are adapted to include three magnetic flux sensors 1660 each (e.g. six magnetic flux sensors 1660 total). However, the electromagnetic machine 1600 may include any suitable number of one or more magnetic flux sensors 1660.

As also depicted in FIG. 15A and FIG. 15B, the electromagnetic machine 1600 includes a data connector 1670, adjacent the depicted pair of the connectors 1623, and wiring and/or harnessing 1675 between the data connector 1670 and the one or more magnetic flux sensors 1660. The electromagnetic machine 1600 is otherwise understood to be similar to the electromagnetic machine 1500 and/or other electromagnetic machines provided herein.

While the harnessing 1675 is depicted as being between the magnetic flux sensors 1660 and the data connector 1670 and located around sides of the electromagnetic machine 1600, the harnessing 1675 may be in any suitable position and/or path at the electromagnetic machine 1600 and may be attached to any suitable portion of the electromagnetic machine 1600 via any suitable combination of fasteners, clips, brackets, loops, belts and the like. For example, as best seen in FIG. 15A, the harnessing 1675 may be attached to the back-iron portions 1608 via fasteners 1690 (not depicted in FIG. 15B but nonetheless understood to be present). Furthermore, the harnessing 1675 is understood to be between the electrical windings 1613 and the pole portions 1609 (e.g. as indicated by dashed portions of the harnessing 1675 in FIG. 15A). Hence, in general, the harnessing 1675 is understood to be self-contained at electromagnetic machine 1600 (e.g. and is not attached to external structures such as a vehicle, and the like, to which electromagnetic machine 1600 may be attached. In particular, as mentioned above, such routing of the harnessing 1675 may be provided in a manner such that the electrical windings are removable without affecting and/or removing the wiring and/or harnessing and/or the magnetic flux sensors.

While, the data connector 1670 is depicted in a particular position, it is understood that the data connector 1670 may be in any suitable position and is understood to generally connect to a complementary data connector that connects the one or more magnetic flux sensors 1660 to a computing device (e.g. at a vehicle to which the electromagnetic machine 1600 is attached), for example to control power to the electromagnetic machine 1600 in a feedback loop with measured magnetic flux. The data connector 1670 and the harnessing 1675 may further convey power to the one or more magnetic flux sensors 1660 (e.g. which may require power to function).

Similarly, connectors of electromagnetic machines provided herein may be in any suitable positions.

For example, attention is next directed to FIG. 16A, FIG. 16B and FIG. 16C which respectively depict different views of electromagnetic machines 1700-1, 1700-2, 1700-3 (e.g. electromagnetic machines 1700 and/or an electromagnetic machine 1700) having different connector configurations. To better show details of the connector configurations, in each of FIG. 16A, FIG. 16B and FIG. 16C, a respective left hand side shows a top view of a respective electromagnetic machine 1700, electrical windings, cold plates, and other components removed (e.g. similar to the view of the electromagnetic machine 1500 in FIG. 14C), but showing positions/configurations of respective connectors and trays, and a respective right hand side shows a schematic end view of a respective electromagnetic machine 1700 (e.g. similar to the view of the electromagnetic machine 1500 in FIG. 14B) showing positions/configurations of respective connectors and trays.

As depicted, the electromagnetic machines 1700 include respective segmented magnets 1701 and two respective pole portions 1709.

With attention first directed to FIG. 16A, the electromagnetic machine 1700-1 is understood to comprise two pairs of connectors 1723-1, on opposite sides of the electromagnetic machine 1700-1, supported by respective trays 1724-1. While depicted schematically, the connectors 1723-1 and trays 1724-1 are understood to be substantially similar, respectively, to the connectors 123 and the trays 124. Similar to the electromagnetic machines 100, two pairs of connectors 1723-1 face in opposite directions, perpendicularly facing outward and away from the pole portions 1709, on opposite sides of the electromagnetic machine 1700-1, and at opposite ends of the electromagnetic machine 1700-1, with the trays 1724-1 adapted accordingly. Hence, the connectors 1723-1 of the electromagnetic machine 1700-1 have a similar configuration to the connectors 123 of the electromagnetic machine 100.

With attention next directed to FIG. 16B, the electromagnetic machine 1700-2 is understood to comprise two pairs of connectors 1723-2, supported by respective trays 1724-2, which are substantially similar, respectively, to the connectors 1723-1 and the trays 1724-1. However, in contrast to the electromagnetic machine 1700-1, the two pairs of connectors 1723-2 are located on a same side of the electromagnetic machine 1700-2, facing a same direction, perpendicularly facing outward and away from the pole portions 1709 at opposite ends of the electromagnetic machine 1700-2, with the trays 1724-2 adapted accordingly.

With attention next directed to FIG. 16C, the electromagnetic machine 1700-3 is understood to comprise two pairs of connectors 1723-3 located on a same side of the electromagnetic machine 1700-3, at opposite ends of the electromagnetic machine 1700-3, and supported by respective trays 1724-3. However, in contrast to the electromagnetic machines 1700-1, 1700-2, the two pairs of connectors 1723-3 are oriented "downward" and/or in a direction perpendicular to that of the connectors 1723-1, 1723-2, with the trays 1724-3 adapted accordingly.

Hence, FIG. 16A, FIG. 16B and FIG. 16C illustrate that connectors of electromagnetic machines provided herein may be in any suitable orientation and/or direction, for example for compatibility with an orientation and/or direction of respective complementary connectors at a vehicle, and the like, to which electromagnetic machines provided herein are attached.

In yet further examples, different physical configurations and/or assemblies of electromagnetic machines may be provided. For example, mounting devices (e.g. similar to the mounting devices 163) and/or retention plates (e.g. similar to the retention plates 159) of electromagnetic machines provided herein may have different physical configurations than the mounting devices 163 and/or the retention plates 159.

For example attention is next directed to FIG. 17A, FIG. 17B and FIG. 17C which respectively depict end views of respective electromagnetic machines 1800-1, 1800-2, 1800-3 (e.g. electromagnetic machines 1800 and/or an electromagnetic machine 1800) that show respective magnets 1801 and examples of different respective mounting devices 1833-1, 1833-2, 1833-3 (e.g. mounting devices 1833 and/or a mounting device 1833) that may be used in place of the mounting devices 163. In FIG. 17A, FIG. 17B and FIG. 17C it is understood that respective retention plates are removed to show respective magnets 1801 and that while only the magnets 1801 and the mounting devices 1833 are depicted, the electromagnetic machines 1800 may be similar to other electromagnetic machines provided herein, and include any suitable components (e.g. pole portions, back-iron portions, electrical windings etc.).

Furthermore, it is understood that each of the electromagnetic machines 1800 may comprise four respective mounting devices 1833, one on either side of a respective magnet 1801, and at opposite ends of the electromagnetic machines 1800. Hence, while FIG. 17A, FIG. 17B and FIG. 17C show end views of the electromagnetic machines 1800, and hence only two respective mounting devices 1833 are visible in FIG. 17A, FIG. 17B and FIG. 17C, it is understood that the electromagnetic machines 1800 may comprise two further respective mounting devices 1833 at an end opposite the depicted end (e.g. similar to the electromagnetic machine 100). However, electromagnetic machines provided herein may include any suitable number of mounting devices (e.g. less than, or greater than, four mounting devices) in any suitable positions.

With attention first directed to FIG. 17A, the mounting devices 1833-1 comprises two sections 1834-1, 1834-2, which are rectangular in shape, and perpendicularly joined together by respective fasteners 1835, for example, a screw, a bolt, and the like. As such, the mounting devices 1833-1 are "L" shaped. Alternatively, the two sections 1834-1, 1834-2 may be welded together and/or integral, and the like.

However, a mounting device 1833 may have any other suitable shape and/or may be provided in one section and/or piece. For example, attention is next directed to FIG. 17B, which shows the mounting devices 1833-2 provided as single respective pieces, which are rectangular in shape.

Similarly, attention is next directed to FIG. 17C, which shows the mounting devices 1833-3 provided as single respective pieces, which are have a shape similar to that of the ferromagnetic body 107.

Hence, FIG. 17A, FIG. 17B and FIG. 17C illustrate that mounting devices of electromagnetic machines provided herein may be in any suitable configuration and/or in any suitable number of sections (e.g. which may be joined together in any suitable manner) and/or be in any suitable shape. In particular, mounting devices of electromagnetic machines provided herein may have internal sides and/or pole-facing sides, and the like, that are of a shape and/or configuration that are suitable for removing and/or replacing electrical windings of the electromagnetic machines. For example, internal sides and/or pole-facing sides, and the like, of mounting devices of electromagnetic machines provided herein may be about parallel to external pole faces, for example which may form gaps and/or apertures of suitable shapes at which replaceable electrical windings may be removed and/or inserted.

For example attention is next directed to FIG. 18A, FIG. 18B and FIG. 18C which respectively depict end views of respective electromagnetic machines 1900-1, 1900-2, 1900-3 (e.g. electromagnetic machines 1900 and/or an electromagnetic machine 1900) that show respective magnets 1901, and examples of different respective retention plates 1929-1, 1929-2, 1929-3 (e.g. retention plates 1929 and/or a retention plate 1929) that may be used in place of the retention plates 159. In FIG. 18A, FIG. 18B and FIG. 18C it is understood that respective mounting devices 1933 are similar to the mounting devices 1833-3, but that any suitable mounting device may be used. It is further understood that while only the magnets 1901, the retention plates 1929 and the mounting devices 1933 are depicted, the electromagnetic machines 1900 may be similar to other electromagnetic machines provided herein, and include any suitable components (e.g. pole portions, back-iron portions, electrical windings etc.).

Furthermore, it is understood that each of the electromagnetic machines 1900 may comprise two respective retention plates 1929, one on either side of a respective magnet 1901, and at opposite ends of the electromagnetic machines 1900. Hence, while FIG. 18A, FIG. 18B and FIG. 18C show end views of the electromagnetic machines 1900, and hence only one respective retention plate 1929 is visible in FIG. 18A, FIG. 18B and FIG. 18C, it is understood that the electromagnetic machines 1900 may comprise a further respective retention plate 1929 at an end opposite the depicted end (e.g. similar to the electromagnetic machine 100).

With attention first directed to FIG. 18A, the retention plate 1929-1 comprises a band (and/or a narrow plate), and the like, which is rectangular in shape, and extends perpendicularly between the opposing mounting devices 1933. While not depicted, the retention plate 1929-1 may be joined to the mounting devices 1933 (e.g. by respective fasteners such as bolts, and the like, not depicted, and/or welding, and the like, etc.), and/or be integral with one or more of the mounting devices 1933.

However, a retention plate 1929 may have any other suitable shape and/or may be provided in one section and/or piece. For example, attention is next directed to FIG. 18B, which shows the retention plate 1929-2 provided as a plate, which is rectangular in shape, and which may be joined to the mounting devices 1933 (e.g. by respective fasteners such as bolts, and the like, not depicted, and/or welding, and the like, etc.), and/or be integral with one or more of the mounting devices 1933.

Furthermore, a retention plate may be provided in more than one section. For example, attention is next directed to FIG. 18C, which shows the retention plate 1929-3 provided in two sections 1934-1, 1934-2, each of the sections 1934-1, 1934-2 comprising respective bands, and the like, which are rectangular in shape, and extend perpendicularly between the opposing mounting devices 1933. While not depicted, one or more of the sections 1934-1, 1934-2 of the retention plate 1929-3 may be joined to the mounting devices 1933 (e.g. by respective fasteners such as bolts, and the like, not depicted, and/or welding, and the like, etc.), and/or be integral with one or more of the mounting devices 1933.

Hence, FIG. 18A, FIG. 18B and FIG. 18C illustrate that retention plates of electromagnetic machines provided herein may be in any suitable configuration and/or in any suitable number of sections and/or be in any suitable shape.

Furthermore, such retention plates may be shaped to facilitate replacement of electrical windings of electromagnetic machines provided herein.

It is hence further understood that any features of any of the electromagnetic machines provided herein may be combined in any suitable manner with features of other electromagnetic machines provided herein.

In this specification, components may be described as "configured to" perform one or more functions or "configured for" such functions. In general, a component that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, XZ, and the like). Similar logic can be applied for two or more items in any occurrence of "at least one . . . " and "one or more . . . " language.

The terms "about", "substantially", "essentially", "approximately", and the like, are defined as being "close to", for example as understood by persons of skill in the art. In some examples, the terms are understood to be "within 10%," in other examples, "within 5%", in yet further examples, "within 1%", and in yet further examples "within 0.5%".

Persons skilled in the art will appreciate that in some examples, the functionality of computing devices (e.g. computing device 1590) and/or methods and/or processes described herein can be implemented using pre-programmed hardware or firmware elements (e.g., an application specific integrated circuit (ASIC), a Field Programmable Gate Array (FPGA), a programmable array logic (PAL), a programmable logic array (PLA), a programmable logic device (PLD), electrically erasable programmable read-only memories (EEPROMs), etc.), or other related components. In other examples, the functionality of the computing devices and/or methods and/or processes described herein can be achieved using a computing apparatus that has access to a code memory (not shown) which stores computer-readable program code for operation of the computing apparatus. The computer-readable program code could be stored on a computer readable storage medium which is fixed, tangible and readable directly by these components, (e.g., removable diskette, CD-ROM (Compact Disc-Read-Only Memory), ROM (Read-Only Memory), fixed disk, USB (Universal Serial Port) drive, optical drive, and the like). Furthermore, it is appreciated that the computer-readable program can be stored as a computer program product comprising a computer usable medium. Further, a persistent storage device can comprise the computer readable program code. It is yet further appreciated that the computer-readable program code and/or computer usable medium can comprise a non-transitory computer-readable program code and/or non-transitory computer usable medium. Alternatively, the computer-readable program code could be stored remotely but transmittable to these components via a modem or other interface device connected to a network (including, without limitation, the Internet) over a transmission medium. The transmission medium can be either a non-mobile medium (e.g., optical and/or digital and/or analog communications lines) or a mobile medium (e.g., microwave, infrared, free-space optical or other transmission schemes) or a combination thereof. Furthermore, such computing devices (e.g. computing device 1590) and/or methods and/or processes described herein may be implemented using "engines" which may be understood to include hardware (e.g. implemented as an ASIC, an FPGA, a PAL, a PLA, a PLD etc.), and/or a combination of hardware and software (e.g. a combination of hardware and software includes software hosted at hardware, such as a software module that is stored at a processor-readable memory implemented or interpreted by a processor), or hardware and software hosted at hardware.

Persons skilled in the art will appreciate that there are yet more alternative examples and modifications possible, and that the above examples are only illustrations of one or more examples. The scope, therefore, is only to be limited by the claims appended hereto.

What is claimed is:

1. An electromagnetic machine comprising:
a ferromagnetic body extending along a longitudinal axis, the ferromagnetic body comprising: a back-iron portion; and a pole portion extending from the back-iron portion, the pole portion having parallel external sides;
a replaceable winding located on the pole portion comprising:
a body having a longitudinal axis, the body comprising opposing surfaces along the longitudinal axis;
an aperture through the body, between the opposing surfaces, the aperture having generally parallel internal sides about perpendicular to the opposing surfaces of the body, the aperture configured to removably receive a pole portion of the electromagnetic machine;
electrical conductors wound about the aperture in the body; and
electrical connectors at one or more external sides of the body, the electrical connectors connected to the electrical conductors; and
at least one removable retention mechanism to removably retain the replaceable winding at the pole portion, the at least one removable retention mechanism comprising at least one ferromagnetic retainer removably attached to an external surface of the pole portion extending at least partially across an outward opposing surface of the replaceable winding.

2. The electromagnetic machine of claim 1, wherein the aperture has a rectangular cross-section.

3. The electromagnetic machine of claim 1, wherein the aperture has a square cross-section.

4. The electromagnetic machine of claim 1, wherein the opposing surfaces are flat.

5. The electromagnetic machine of claim 1, wherein the body is generally planar and the generally parallel internal sides are about perpendicular to a plane of the body.

6. The electromagnetic machine of claim 1, wherein an opposing surface facing the electromagnetic machine is complementary to a respective surface of the electromagnetic machine at which the opposing surface is configured to be located.

7. The electromagnetic machine of claim 1, wherein the electrical connectors are located at an end of the body about perpendicular to the longitudinal axis.

8. The electromagnetic machine of claim 1, wherein the electrical connectors are located at a side of the body about parallel to the longitudinal axis.

9. An electromagnetic machine comprising:
a ferromagnetic body extending along a longitudinal axis, the ferromagnetic body comprising: a back-iron portion; and a pole portion extending from the back-iron portion, the pole portion having parallel external sides; and a replaceable winding located on the pole portion comprising: a body along the longitudinal axis, the body comprising opposing surfaces along the longitudinal axis; an aperture through the body, between the opposing surfaces, along the longitudinal axis, the aperture having parallel internal sides about perpendicular to the opposing surfaces of the body, the aperture configured to removably receive the pole portion such that the parallel external sides of the pole portion and the parallel internal sides of the aperture are adjacent when the replaceable winding is on the pole portion; electrical conductors wound about the aperture in the body; and electrical connectors at one or more external sides of the body, the electrical connectors connected to the electrical conductors;

at least one removable retention mechanism to removably retain the replaceable winding at the pole portion; and at least one plate removably retained at a ledge of the back-iron portion adjacent the pole portion, the replaceable winding located on the at least one plate, and the at least one removable retention mechanism comprising one or more straps around the replaceable winding and the at least one plate.

10. The electromagnetic machine of claim 9, further comprising one or more relief cuts on external sides of the pole portion and the ledge, the one or more relief cuts configured to receive a respective strap.

11. The electromagnetic machine of claim 9, wherein the at least one plate comprises a gap extending between an external edge of the at least one plate and the pole portion to interrupt eddy currents in the at least one plate around the pole portion.

12. The electromagnetic machine of claim 9, wherein the at least one plate is interrupted by a gap which is disposed between an external edge of the at least one plate and the pole portion, to interrupt eddy currents in the at least one plate around the pole portion.

13. The electromagnetic machine of claim 9, wherein the at least one plate comprises a gap extending between an external edge of the at least one plate and the pole portion, wherein electrical connections between the electrical conductors to the electrical connectors of the replaceable winding extend from the parallel internal sides of the aperture through the gap.

14. The electromagnetic machine of claim 9, in which the at least one plate comprises at least one cold plate.

15. The electromagnetic machine of claim 9, further comprising one or more trays for removably receiving the electrical connectors.

16. The electromagnetic machine of claim 9, wherein an opposing surface of the replaceable winding facing the electromagnetic machine is complementary to a respective surface of the electromagnetic machine on which the opposing surface is located.

17. An electromagnetic machine comprising:

a ferromagnetic body extending along a longitudinal axis, the ferromagnetic body comprising: a back-iron portion; and a pole portion extending from the back-iron portion, the pole portion having parallel external sides; and a replaceable winding located on the pole portion comprising: a body along the longitudinal axis, the body comprising opposing surfaces along the longitudinal axis; an aperture through the body, between the opposing surfaces, along the longitudinal axis, the aperture having parallel internal sides about perpendicular to the opposing surfaces of the body, the aperture configured to removably receive the pole portion such that the parallel external sides of the pole portion and the parallel internal sides of the aperture are adjacent when the replaceable winding is on the pole portion; electrical conductors wound about the aperture in the body; and electrical connectors at one or more external sides of the body, the electrical connectors connected to the electrical conductors;

at least one removable retention mechanism to removably retain the replaceable winding at the pole portion;

a ledge of the back-iron portion adjacent the pole portion, the replaceable winding located on the ledge;

one or more relief cuts on external sides of the pole portion and the ledge; and one or more strap retainers removably attached in corresponding relief cuts at the ledge, the at least one removable retention mechanism comprising one or more straps around the replaceable winding and the one or more strap retainers, the one or more relief cuts configured to receive a respective strap.

18. The electromagnetic machine of claim 1, further comprising at least one cold plate between the at least one ferromagnetic retainer and the outward opposing surface of the replaceable winding.

* * * * *